(12) United States Patent
Lazar et al.

(10) Patent No.: US 11,789,092 B2
(45) Date of Patent: Oct. 17, 2023

(54) MAGNETIC SENSOR DEVICES, SYSTEMS AND METHODS WITH ERROR DETECTION

(71) Applicant: Melexis Technologies SA, Bevaix (CH)

(72) Inventors: Zsombor Lazar, Bevaix (CH); Mathieu Poezart, Bevaix (CH); Lionel Tombez, Bevaix (CH)

(73) Assignee: MELEXIS TECHNOLOGIES SA, Bevaix (CH)

( * ) Notice: Subject to any disclaimer, the term of this patent is extended or adjusted under 35 U.S.C. 154(b) by 0 days.

(21) Appl. No.: 17/837,456

(22) Filed: Jun. 10, 2022

(65) Prior Publication Data
US 2022/0404438 A1  Dec. 22, 2022

(30) Foreign Application Priority Data
Jun. 19, 2021 (EP) ..................................... 21180493

(51) Int. Cl.
*G01R 33/00* (2006.01)
*G01R 33/07* (2006.01)

(52) U.S. Cl.
CPC ....... *G01R 33/0029* (2013.01); *G01R 33/077* (2013.01)

(58) Field of Classification Search
CPC ............ G01R 33/0005; G01R 33/0011; G01R 33/0023; G01R 33/0029; G01R 33/02; G01R 33/022; G01R 33/06; G01R 33/07; G01R 33/072; G01R 33/077; G01D 3/08
See application file for complete search history.

(56) References Cited

U.S. PATENT DOCUMENTS

| | | | |
|---|---|---|---|
| 2008/0106257 A1* | 5/2008 | Suzuki | G01R 31/2829 324/202 |
| 2010/0237859 A1* | 9/2010 | Kotter | G01R 33/093 324/252 |
| 2018/0195852 A1 | 7/2018 | Bilbao De Mendizabal et al. | |
| 2019/0079142 A1* | 3/2019 | Close | G01R 33/07 |
| 2019/0107552 A1 | 4/2019 | Muramatsu et al. | |
| 2020/0011955 A1 | 1/2020 | Motz et al. | |
| 2020/0408564 A1 | 12/2020 | Granig | |
| 2021/0114567 A1 | 4/2021 | Rebholz-Goldmann et al. | |

OTHER PUBLICATIONS

European Search Report from corresponding Application No. EP 21180493.5, dated Dec. 13, 2021.

* cited by examiner

*Primary Examiner* — Giovanni Astacio-Oquendo
*Assistant Examiner* — David B Frederiksen
(74) *Attorney, Agent, or Firm* — WORKMAN NYDEGGER

(57) ABSTRACT

A method of magnetic sensing uses at least two magnetic sensing elements including a first and a second magnetic sensor element. The method includes: a) measuring in a first configuration a combination of the first and second signal obtained from both sensors; b) measuring in a second configuration an individual signal obtained from the first sensor only; c) testing a consistency of the combined signal and the individual signal, or testing a consistency of signals derived therefrom, in order to detect an error. A sensor device is configured for performing this method. A sensor system includes the sensor device and optionally a second processor connected thereto.

16 Claims, 22 Drawing Sheets

In mode2, measure:
Bx_part = (v1)

Consitency check:
compare (Bx_full or Bx_avg) and Bx_part

In mode2, measure:
Bx_part = (v1)
By_part = (v3)

Optionally calculate:
φ_part=atan2(Bx_part,By_part)

Consistency check:
i) comparing components:
  compare Bx_full and Bx_part;
  compare By_full and By_part;

and/or ii) compare angles:
  φ_full and φ_part set1: V1, V3 (used in mode1 and in mode2)
set2: V2, V4 (used in mode1, but not in mode2)

Associated Elements:
H1 and H2
H3 and H4
H5 and H6
H7 and H8
↑ ↑
set1 set2

In mode1, measure:
Bx_full = (h3+h4)-(h1+h2)
By_full = (h5+h6)-(h7+h8)
Bz_full = (h3+h4)+(h1+h2)   [optional]

Optionally calculate:
φxy_full=atan2(Bx_full,By_full)
φxz_full=atan2(Bx_full,Bz_full)

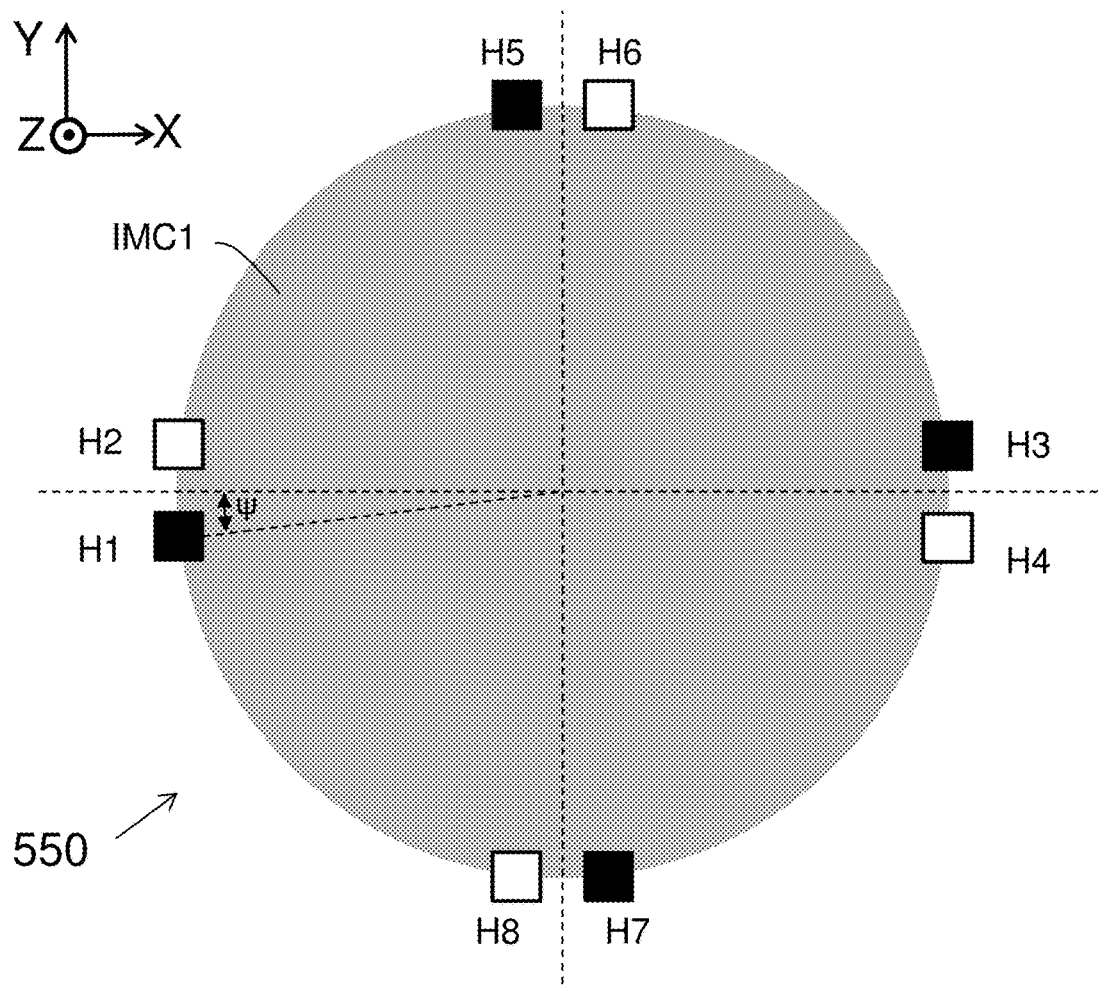

In mode2, measure and/or calculate:
$Bx\_part = (h3)-(h1)$
$By\_part = (h5)-(h7)$
$Bz\_part = (h3)+(h1)$ [optional]

Optionally calculate:
$\varphi xy\_part = atan2(Bx\_part, By\_part)$
$\varphi xz\_part = atan2(Bx\_part, Bz\_part)$ Consistency check:
i) compare components:
    compare Bx_full and Bx_part;
    compare By_full and By_part;
    compare Bz_full and Bz_part; [optional]

and/or ii) compare angles:
    compare $\varphi xy\_full$ and $\varphi xy\_part$
    compare $\varphi xz\_full$ and $\varphi xz\_part$ [optional]

FIG. 5B

In mode1, measure and/or calculate:
dBz/dx_full = (h3+h4)-(h1+h2)
dBz/dy_full = (h5+h6)-(h7+h8)

Optionally calculate:
φ_full=atan2(dBz/dx_full,dBz/dy_full)

Associated Elements:
H1a and H2a
H3a and H4a
H5a and H6a
H7a and H8a
H1b and H2b
H3b and H4b
H5b and H6b
H7b and H8b In mode2, measure one or more of:
Bxa_part = (h3a)-(h1a)
Bya_part = (h5a)-(h7a)
Bza_part = (h1a)+(h3a)

Bxb_part = (h3b)-(h1b)
Byb_part = (h5b)-(h7b)
Bzb_part = (h1b)+(h3b)

Optionally calculate one or more of:
dBx/dx_part = Bxb_part - Bxa_part
dBy/dx_part = Byb_part - Bya_part
dBz/dx_part = Bzb_part - Bza_part
φxz_part=atan2(dBx/dx_part,dBz/dx_part)
φxy_part=atan2(dBx/dx_part,dBy/dx_part)
φyz_part=atan2(dBy/dx_part,dBz/dx_part)

Associated:
H1a and H2a
H3a and H4a
H1b and H2b
H3b and H4b

In mode1, measure or calculate:
Bxa_full = (h3a+h4a)-(h1a+h2a)
Bxb_full = (h3b+h4b)-(h1b+h2b)
Bza_full = (h1a+h2a)+(h3a+h4a)
Bzb_full = (h1b+h2b)+(h3b+h4b)

Calculate:
dBx/dx_full = Bxb_full- Bxa_full
dBz/dx_full = Bzb_full- Bza_full
φ_full=atan2(dBx/dx_full,dBz/dx_full)

In mode1, measure and/or calculate:
$Bx\_avg = (h2a+h2b)-(h1a+h1b)$
$Bz\_avg = (h2a+h2b)+(h1a+h1b)$ Optionally Calculate:
$\varphi\_avg = atan2(Bx\_avg, Bz\_avg)$

MAGNETIC SENSOR DEVICES, SYSTEMS AND METHODS WITH ERROR DETECTION

FIELD OF THE INVENTION

The present invention relates in general to the field of magnetic sensor devices, systems and methods, and more in particular to magnetic sensor devices, systems and methods with error detection capabilities.

BACKGROUND OF THE INVENTION

Magnetic sensors, e.g. current sensors, proximity sensors, position sensors, etc. are known in the art. They are based on measuring a magnetic field characteristic at one or multiple sensor locations. Depending on the application, the measured field characteristic(s) may be used to deduct another quantity, such as e.g. a current strength, proximity of a so called target, relative position of a sensor device to a magnet, etc.

Many variants of magnetic sensor devices, systems and methods exist, addressing one or more of the following requirements: using a simple or cheap magnetic structure, using a simple or cheap sensor device, being able to measure over a relatively large range, being able to measure with great accuracy, requiring only simple arithmetic, being able to measure at high speed, being highly robust against positioning errors, being highly robust against an external disturbance field, providing redundancy, being able to detect an error, being able to detect and correct an error, having a good signal-to-noise ratio (SNR), etc. Often two or more of these requirements conflict with each other, hence a trade-off needs to be made.

Magnetic sensors are often used in robotic and automotive applications, where fault detection is important for safety of machines and people using them.

Magnetic sensor devices with error detection capabilities are known, but they often involve duplicating the hardware, which is less compact and more costly.

There is always room for improvements or alternatives.

SUMMARY OF THE INVENTION

It is an object of embodiments of the present invention to provide a magnetic sensor method, device and system capable of measuring a magnetic field, and capable of detecting an error, (e.g. an error related to a defective sensor element or a defective transducer, or a defective biasing thereof, or a defective readout thereof).

It is an object of embodiments of the present invention to provide a magnetic sensor method, device and system which is capable of measuring a magnetic field with improved accuracy, e.g. with an improved signal-to-noise ratio (as compared with some prior art).

It is an object of embodiments of the present invention to provide a magnetic sensor method, device and system which is capable of detecting an error in a relatively simple manner and/or by adding only minimal hardware.

It is an object of embodiments of the present invention to provide a magnetic sensor method, device and system which is capable of measuring a magnetic field and detecting an error with improved performance (e.g. requiring only two data acquisition steps instead of three).

It is an object of embodiments of the present invention to provide a magnetic sensor device that provides accurate measurement data and a validity value (or error indication). In this case, it is not required to perform a consistency test outside the sensor device, although it may.

It is an object of embodiments of the present invention to provide a magnetic sensor device that provides accurate measurement data, and also outputs auxiliary data for allowing error detection to be performed outside of the sensor device, e.g. in an ECU.

It is an object of particular embodiments of the present invention to provide a method of determining a position of a sensor device relative to a magnet or a magnetic structure, and to provide additional information indicative of an error, and/or to provide additional information allowing the detection of an error by another processor connected to the sensor device. It is also an object of embodiments of the present invention to provide a sensor device and system configured for performing this method.

It is an object of particular embodiments of the present invention to provide such a system, device and method, wherein the position is determined in a manner which is highly insensitive to an external disturbance field (also known as "stray field").

These and other objectives are accomplished by embodiments of the present invention.

According to a first aspect, the present invention provides a method of measuring at least one magnetic quantity in a reliable manner, using an integrated circuit that comprises: a first set of N magnetic sensor elements, N being at least one; a second set of N magnetic sensor elements; a configurable interconnection circuit adapted for selectively connecting and disconnecting an element of the second set to/from an associated element of the first set; and a processing circuit for configuring the interconnection circuit; the method comprising the steps of: a) configuring the interconnection circuit in a first mode wherein each element of the first set is connected to an associated (or corresponding) element of the second set (e.g. in parallel or in series) for generating N combined signals, and measuring these N combined signals; b) configuring the interconnection circuit in a second mode wherein each element of the first set is disconnected from its associated element of the second set, and measuring N individual signals from the N magnetic sensor elements of the first set; c) performing a consistency test of the combined signals and the individual signals, and/or performing a consistency test of first signals derived from the combined signals and second signals derived from the individual signals; and providing an outcome of the consistency test as a validity signal; and outputting at least one signal selected from the group consisting of said combined signals, said individual signals, said first signals and said second signals; or outputting at least one of the combined signals and/or one of the first signals derived from the combined signals, and outputting at least one of the individual signals and/or one of the second signals derived from the individual signals, for allowing an external processor (ECU) to perform a consistency check.

This method can be performed by a magnetic sensor device comprising at least two magnetic sensing elements, e.g. as illustrated in the block-diagram of FIG. 3D.

The inventors surprisingly found that it is possible to detect an error of either the first magnetic sensor element or the second magnetic sensor element, by performing a consistency check of the combined signal (e.g. a linear combination signal or a sum signal or an average signal or a weighted average signal) and only one of the individual signals (e.g. either the signal obtained from the first magnetic sensor element, or the signal obtained from the second magnetic sensor element). This is one of the underlying principles of the present invention. It is counter-intuitive that an error of e.g. the second sensor element can be detected without comparing the signal v2 provided by the second sensor element with something.

It is noted that the individual signal(s) or the second signal(s) derived therefrom may be (and typically are indeed) less accurate than the combined signal(s) or the first signal(s) derived therefrom, but it was found that they are typically good enough, e.g. sufficiently accurate for detecting an error.

The integrated circuit may comprise a semiconductor substrate. The semiconductor substrate may comprise the sensor elements, the interconnection circuit and the processor.

The integrated circuit may further comprise at least one analog-to-digital convertor for digitizing at least one of the combined signal(s), the individual signal(s), the first signal(s) derived from the combined signal(s), and the second signal(s) derived from the individual signal(s).

The signal from the first magnetic sensor element and the signal from the second magnetic sensor element is "combined" in the analogue domain, before digitisation. In this way quantitation noise is reduced and thus accuracy is improved.

The combined signal is preferably a linear combination of a first sensor signal and a second sensor signal, for example a sum, or an average, or a weighted average using two strictly positive coefficients different from zero.

In an embodiment, the combined signal(s) is/are generated using an active component, such as e.g. a subtraction circuit comprising an operational amplifier, or an addition circuit comprising an operational amplifier.

In an embodiment, the combined signal(s) is/are generated in a passive manner, by connecting the first sensor element and the second sensor element in series or in parallel, e.g. using a switch, e.g. a MOSFET switch.

Preferably the first sensor element and the second sensor element are substantially identical (e.g. are made using the same layout symbol, and the same size), differing only by production tolerances and imperfections.

In an embodiment, step c) comprises one of the following options:
i) outputting the N combined signals, and testing a consistency of the N combined signals and the N individual signals, and providing an outcome of the consistency test as a validity signal;
ii) outputting the N combined signals and the N individual signals, for allowing an external processor (ECU) to perform a consistency test;
iii) determining at least one first signal derived from the N combined signals, and determining at least one second signal derived from the N individual signals; and testing a consistency of the N combined signals and the N individual signals, and/or testing a consistency of the at least one first signal and the at least one second signal, and/or testing a consistency of at least one further first signal derived from the first signal and at least one further second signal derived from the second signal; providing an outcome of the consistency test as a validity signal; and outputting at least one signal selected from the group consisting of said N combined signals, said N individual signals, said at least one first signal, said at least one second signal, said at least one further first signal, and said at at least one further second signal;
iv) determining at least one first signal derived from the N combined signals and determining at least one second signal derived from the N individual signals; and outputting the at least one first signal and the at least one second signal, and/or outputting at least one further first signal derived from the first signal and at least one further second signal derived from the second signal, for allowing an external processor (ECU) to perform a consistency test.

Option i) can be seen as a first option wherein the consistency check is performed inside the sensor device and is based on a comparison of the combined signal(s) and individual signal(s).

Option ii) can be seen as a second option wherein the consistency check is to be performed outside the sensor device and is based on a comparison of the combined signal(s) and individual signal(s).

Option iii) can be seen as a third option wherein the consistency check is performed inside the sensor device and is based on a comparison of at least one first signal and at least one second signal.

Option iv) can be seen as a fourth option wherein the consistency check is to be performed outside the sensor device and is based on a comparison of at least one first signal and at least one second signal.

In an embodiment, the interconnection circuit comprises N switches, adapted for selectively connecting a magnetic sensor element of the first set in parallel or in series with an associated magnetic sensor element of the second set.

Depending on the implementation, step a) may comprise closing said N switches, and step b) may comprise opening said N switches, or vice versa. The inventors surprisingly found that adding a switch (one for each magnetic sensor pair) is basically all that is required for allowing the above-mentioned functionality (assuming that two identical magnetic sensor elements were already present).

In an embodiment, the method further comprises: determining at least one first difference signal (e.g. Bx_full, By_full) by subtracting two combined signals, and determining at least one second difference signal (e.g. Bx_part, By_part) by subtracting two individual signals; and step iii) comprises: testing a consistency of the at least one first difference signal (e.g. Bx_full) and the at least one second difference signal (e.g. Bx_part); and step iv) comprises: outputting the at least one first difference signal (e.g. Bx_full), and outputting the at least one second difference signal (e.g. Bx_part), for allowing an external processor (e.g. ECU) to perform the consistency test.

An example of such embodiment is shown in FIG. 5A, FIG. 7A, FIG. 8A, FIG. 9A where each "difference signals" e.g. Bx_full, By_full, Bx_part, By_part represents a magnetic field component, and where a consistency of the "combined" magnetic field component and the "individual" magnetic field component can be tested.

Another example of such embodiment is shown in FIG. 6A, where each "difference signals" e.g. dBz/dx_full, dBz/dy_full, dBz/dx_part, dBz/dy_part represents a magnetic field gradient, and where a consistency of the "combined" magnetic field gradient and the "individual" magnetic field gradient can be tested.

In an embodiment, the method further comprises: determining at least one first sum signal (e.g. Bz_full) by adding two combined signals, and determining at least one second sum signal (e.g. Bz_part) by adding two individual signals; and step iii) comprises: testing a consistency of the at least one first sum signal (e.g. Bz_full) and the at least one second sum signal (e.g. Bz_part); and step iv) comprises: outputting the at least one first sum signal (e.g. Bz_full), and outputting the at least one second sum signal (e.g. Bz_part), for allowing an external processor (e.g. ECU) to perform the consistency test.

An example of such embodiment is shown in FIG. 5A, FIG. 7A, FIG. 8A and FIG. 9A where Bz_full, Bz_part, Bz_avg, represent a magnetic field component, and where a consistency of the "combined" magnetic field component and the "individual" magnetic field component can be tested.

In an embodiment, the method further comprises: determining at least one first difference signal (e.g. Bx_full, By_full) by subtracting two combined signals, and determining at least one second difference signal (e.g. Bx_part, By_part) by subtracting two individual signals, and calculating a first angular value (e.g. φxy_full) based on a ratio of two first difference signals, and calculating a second angular value (e.g. φxy_part) based on a ratio of two second difference signals; and step iii) comprises: testing a consistency of the first angular value (e.g. φxy_full) and the second angular value (e.g. φxy_part); and step iv) comprises: outputting the first angular value (e.g. φxy_full) and the second angular value (e.g. φxy_part), for allowing an external processor (e.g. ECU) to perform the consistency test. Examples of this embodiment are shown in FIG. 5A and FIG. 6A and FIG. 9A.

In an embodiment, the method further comprises: determining at least one first difference signal (e.g. Bx_full) by subtracting two combined signals, and determining at least one second difference signal (e.g. Bx_part) by subtracting two individual signals, and determining at least one first sum signal (e.g. Bz_full) by adding or averaging two combined signals, and determining at least one second sum signal (e.g. Bz_part) by adding or averaging two individual signals, and calculating a first angular value (e.g. φxz_full) based on a ratio of a first difference signal and a first sum signal, and calculating a second angular value (e.g. φxz_part) based on a ratio of a second difference signal and a second sum signal; and step iii) comprises: testing a consistency of the first angular value (e.g. φxz_full) and the second angular value (e.g. φxz_part); and step iv) comprises: outputting the first angular value (e.g. φxz_full) and the second angular value (e.g. φxz_part), for allowing an external processor (e.g. ECU) to perform the consistency test. Examples of this embodiment are shown in FIG. 5A and FIG. 9A.

In an embodiment, the method further comprises: determining at least one first difference signal (e.g. Bxa_full, Bya_full) by subtracting two combined signals, and determining at least one second difference signal (e.g. Bxa_part, Bya_part) by subtracting two individual signals, and/or determining at least one first sum signal (e.g. Bz_full) by adding or averaging two combined signals, and determining at least one second sum signal (e.g. Bz_part) by adding or averaging two individual signals, and determining at least one third difference signal (e.g. dBx/dx_full, dBy/dx_full) by subtracting two first difference signals or by subtracting two first sum signals, and determining at least one fourth difference signal (e.g. dBx/dx_part, dBy/dx_part) by subtracting two second difference signals or by subtracting two second sum signals; and step iii) comprises: testing a consistency of the at least one third difference signal (e.g. dBx/dx_full; dBz/dx_full) and the at least one fourth difference signal (e.g. dBx/dx_part; dBz/dx_part); and step iv) comprises: outputting the at least one third difference signal (e.g. dBx/dx_full) and the at least one fourth difference signal (e.g. dBx/dx_part), for allowing an external processor (e.g. ECU) to perform the consistency test. Examples of this embodiment are shown in FIG. 7A and FIG. 8A.

In an embodiment, the method further comprises: determining at least one first difference signal (e.g. Bxa_full, Bya_full) by subtracting two combined signals, and determining at least one second difference signal (e.g. Bxa_part, Bya_part) by subtracting two individual signals, and/or determining at least one first sum signal (e.g. Bz_full) by adding or averaging two combined signals, and determining at least one second sum signal (e.g. Bz_part) by adding or averaging two individual signals, and determining at least one third difference signal (e.g. dBx/dx_full, dBy/dx_full) by subtracting two first difference signals or by subtracting two first sum signals, and determining at least one fourth difference signal (e.g. dBx/dx_part, dBy/dx_part) by subtracting two second difference signals or by subtracting two second sum signals; and calculating a first angular value (e.g. φxy_full, φxz_full) based on a ratio of two third difference signals, and calculating a second angular value (e.g. φxy_part, φxz_part) based on a ratio of two fourth difference signals; and step iii) comprises: testing a consistency of the first angular value (e.g. φxy_full, φxz_full) and the second angular value (e.g. φxy_part, φxz_part); and step iv) comprises: outputting the first angular value (e.g. φxy_full, φxz_full) and the second angular value (e.g. φxy_part, φxz_part), for allowing an external processor (e.g. ECU) to perform the consistency test. Examples of this embodiment are shown in FIG. 7A and FIG. 8A.

According to a second aspect, the present invention also provides a method of determining a linear or angular position of a sensor device which is movable relative to a magnetic source or vice versa, and detecting an error, the method comprising: a) determining at least one angular value (e.g. φ_full) and detecting an error using a method according an embodiment of the first aspect wherein an angular value is calculated; and b) converting the angular value into a linear or angular position.

Step b) may be performed in known manners, and hence does not need to be explained in full detail here. Suffice it to say that in case of a linear system, step b) may comprise for example offset correction, and scaling with a predefined constant (e.g. in case of a multi-pole magnet), and optionally the addition of an integer number of complete turns. In case of a linear system, step b) may comprise for example offset correction, and conversion of the angular value to a linear value by scaling with a predefined constant and optionally the addition of an integer number of pole pitches.

According to a third aspect, the present invention also provides a sensor device comprising an integrated circuit and a processing circuit; the integrated circuit comprising: a first set of N magnetic sensor elements, N being an integer value of at least one; a second set of N magnetic sensor elements, a configurable interconnection circuit for selectively connecting and disconnecting each element of the second set to/from an associated element of the first set; the processing circuit being configured for performing a method according to the first aspect or the second aspect.

The sensor device may be a "linear Hall" device, a linear or angular position sensor device, a current sensor device, a proximity sensor device, etc.

In an embodiment, each of the first and second set of N magnetic sensor elements comprises a vertical Hall element, e.g. as illustrated in FIG. 3A.

In an embodiment, each of the first and second set of N magnetic sensor elements comprises two vertical Hall elements oriented in orthogonal directions, e.g. as illustrated in FIG. 4A.

In an embodiment, each of the first and second set of N magnetic sensor elements comprises four horizontal Hall elements arranged near the periphery of a circular IMC, wherein the Hall elements of the first set are spaced apart by multiples of substantially 90°, and wherein the Hall elements of the second set are spaced apart by multiples of substantially 90°, and wherein the Hall elements of the second set are located at a distance smaller than 80 µm with respect to the associated Hall elements of the first set, e.g. as illustrated in FIG. 5A, FIG. 6A.

In an embodiment, each of the first and second set of N magnetic sensor elements comprises four horizontal Hall elements arranged near the periphery of a first circular IMC, and four horizontal Hall elements arranged near the periphery of a second circular IMC, e.g. as illustrated in FIG. 7A.

In an embodiment, each of the first and second set of N magnetic sensor elements comprises two horizontal Hall elements arranged near the periphery of a first circular IMC, and two horizontal Hall elements arranged near the periphery of a second circular IMC, e.g. as illustrated in FIG. 8A.

In an embodiment, the first set of N magnetic sensor elements comprises two horizontal Hall elements arranged near the periphery of a first integrated magnetic concentrator and spaced substantially 180° apart, and the second set of N magnetic sensor elements comprises two horizontal Hall elements arranged near the periphery of a second integrated magnetic concentrator and spaced substantially 180° apart, e.g. as illustrated in FIG. 9B.

In an embodiment, the sensor device is a linear Hall device, configured for measuring a magnetic field component.

In an embodiment, the sensor device is a current sensor device, configured for measuring an electrical current flowing through an electrical conductor, e.g. a busbar.

In an embodiment, the sensor device is a proximity sensor device, configured for detecting the presence or absence of a target within a predefined range.

In an embodiment, the sensor device is an angular position sensor device, configured for providing an angular position of the sensor device relative to a magnetic source.

In an embodiment, the sensor device is a linear position sensor device, configured for providing a linear position of the sensor device relative to a magnetic structure having a plurality of alternating poles.

According to a fourth aspect, the present invention also provides a magnetic sensor system comprising: a sensor device according to the third aspect; and a second processor (e.g. ECU) communicatively connected to the sensor device, and configured for receiving at least some of the signals which are output by the sensor device, and in case of option ii) and option iv) further configured for performing said consistency test. It is noted that the second processor may ignore some of the signals sent by the sensor device.

In an embodiment, the magnetic sensor system further comprises a magnetic source, e.g. a permanent magnet, e.g. an axially or diametrically magnetized two-pole magnet, or an axially or radially magnetized multi-pole magnet having at least four poles, e.g. in the form of a ring magnet or a disk magnet, or an elongated structure comprising a plurality of at least two or at least four or at least six alternating poles.

According to a fifth aspect, the present invention also provides a method of measuring at least one magnetic quantity in a reliable manner using a system according to the fourth aspect, said system comprising a sensor device communicatively coupled to a second processor (e.g. an ECU); wherein the sensor device performs a method according to the first aspect; and wherein at least one of the sensor device and the second device performs a consistency check to detect an error.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIG. 3A illustrates a first mode of operation in which a combination (e.g. a linear combination, e.g. a sum, a weighted sum, or an average) of the signals from the two vertical Hall elements is measured. FIG. 3B illustrates a second mode of operation in which only the signal from one of the vertical Hall elements is measured.

FIG. 4A illustrates a first mode of operation in which signals from two sensor elements are combined before being measured. FIG. 4B illustrates a second mode of operation in which only two individual signals are measured.

FIG. 5A and FIG. 5B is a schematic representation of a circuit comprising only one integrated magnetic concentrator disk and eight horizontal Hall elements. FIG. 5A illustrates a first mode of operation in which signals from the sensor elements are pairwise combined (e.g. added or averaged) before being measured and further processed (e.g. pairwise subtracted). FIG. 5B illustrates a second mode of operation in which signals are not combined before being measured, but wherein four individual signals are measured and further processed (e.g. pairwise subtracted).

FIG. 6A illustrates a first mode of operation (in which signals from associated sensor elements are pairwise combined). FIG. 6B illustrates a second mode of operation.

FIG. 7A illustrates a first mode of operation (in which signals from associated sensor elements are pairwise combined before readout). FIG. 7B illustrates a second mode of operation.

FIG. 8A illustrates a first mode of operation (in which signals from associated sensor elements are pairwise combined before readout). FIG. 8B illustrates a second mode of operation.

FIG. 9A illustrates a first mode of operation. FIG. 9B illustrates a second mode of operation.

Figure 1:
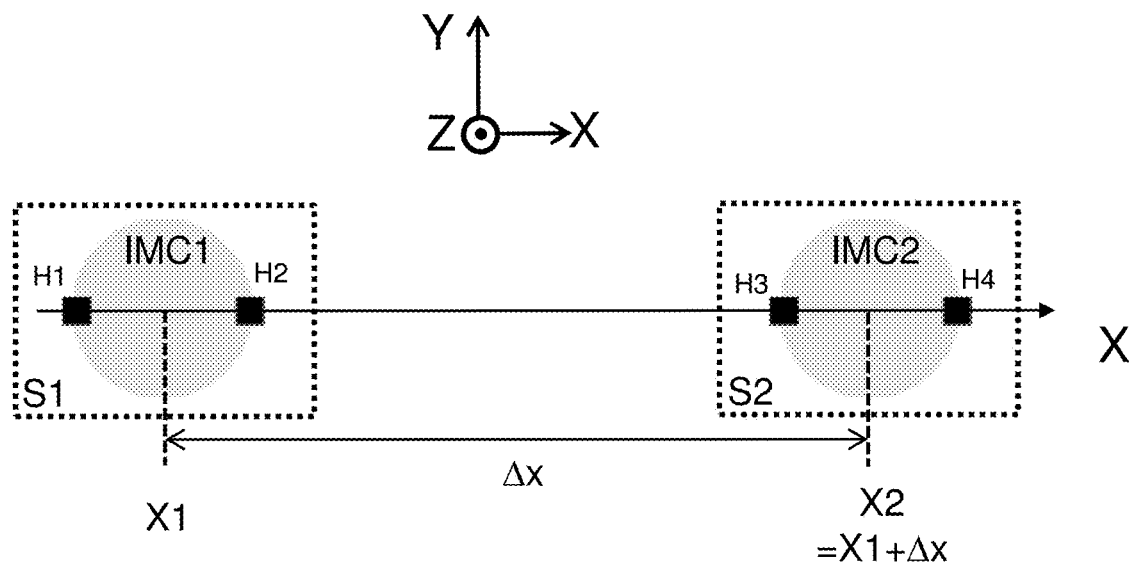
FIG. 1 is a schematic block-diagram of a sensor circuit known in the art. The sensor circuit comprises a first sensor structure at a first location X1, and a second sensor structure at a second location X2 along an X-axis; each sensor structure comprises an integrated magnetic concentrator (IMC) and two horizontal Hall elements arranged on opposite sides of the IMC.

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings, but the invention is not limited thereto but only by the claims.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

The terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In this document, unless explicitly mentioned otherwise, the term "magnetic sensor device" or "sensor device" refers to a device comprising at least two magnetic sensor elements, preferably integrated in a semiconductor substrate. The sensor device may be comprised in a package, also called "chip", although that is not absolutely required.

In this document, the term "sensor element" or "magnetic sensor element" refers to a single vertical Hall element or a single horizontal Hall element or a single magneto-resistive element (e.g. a GMR element or an XMR element).

In this document, the term "magnetic sensor" or "magnetic sensor structure" can refer to a group of components or a sub-circuit or a structure capable of measuring a magnetic quantity, such as for example a group of at least two magnetic sensor elements, or a Wheatstone-bridge containing four MR elements.

In certain embodiments of the present invention, the term "magnetic sensor" or "magnetic sensor structure" may refer to an arrangement comprising one or more integrated magnetic concentrators (IMC), also known as integrated flux concentrators, and two or four or eight horizontal Hall elements arranged near the periphery of the IMC, e.g. as illustrated in FIG. 1, or FIG. 2, or FIG. 5A, or FIG. 8A.

In this document, the expression "in-plane component of a magnetic field vector" and "orthogonal projection of the magnetic field vector in the sensor plane" mean the same. If the sensor device is or comprises a semiconductor substrate, this also means "magnetic field components parallel to the semiconductor substrate".

In this document, the expression "out-of-plane component of a vector" and "Z component of the vector" and "orthogonal projection of the vector on an axis perpendicular to the sensor plane" mean the same.

Embodiments of the present invention are typically described using an orthogonal coordinate system which is fixed to the sensor device, and having three axes X, Y, Z, where the X and Y axis are parallel to the substrate, and the Z-axis is perpendicular to the substrate.

In this document, the expression "spatial derivative" or "derivative" or "spatial gradient" or "gradient" are used as synonyms. In the context of the present invention, a gradient is typically determined as a difference between two values measured at two different locations which may be spaced apart by a distance in the range from 1.0 mm to 3.0 mm. In theory the gradient is calculated as the difference between two values divided by the distance "dx" between the sensor locations, but in practice the division by "dx" is often omitted, because the measured signals need to be scaled anyway.

In this document, horizontal Hall plates are typically referred to by H1, H2, etc., signals from these horizontal Hall plates are typically referred to by h1, h2, etc.; vertical Hall plates are typically referred to by V1, V2, etc.; and signals from these vertical Hall plates are typically referred to by v1, v2, etc.

In the context of the present invention, the formulas arctan(x/y), a tan 2(x,y), arccot(y/x) are considered to be equivalent.

Where in this document reference is made to "a signal provided by a sensor element", this may be a current signal or a voltage signal, unless explicitly mentioned or clear from the context otherwise.

In the context of the present invention, "two associated sensor elements" or "two corresponding sensor elements" mean the same, namely that they are interconnected by means of a configurable interconnection circuit such that a combined signal from these sensor elements can be measured in a first mode, and an individual signal from these sensor elements can be measured in a second mode.

The present invention relates in general to the field of magnetic sensor devices, systems and methods, and more in particular to magnetic sensor devices, systems and methods with error detection capabilities.

Referring to the Figures.

FIG. 1 is a schematic block-diagram of a sensor circuit known in the art. The sensor device comprises a first sensor structure S1 situated at a first location X1, and a second sensor structure S2 situated at a second location X2 along an X-axis. Each sensor structure S1, S2 comprises an integrated magnetic concentrator IMC1, IMC2 and two horizontal Hall elements arranged on opposite sides of said IMC and located on an X-axis. As can be appreciated from the formulas shown in FIG. 1, each IMC with two horizontal Hall elements allows to measure an in-plane magnetic field component Bx oriented in the X-direction (parallel to the semiconductor substrate in which the Hall elements are implemented), and an out-of-plane magnetic field component Bz, oriented in the Z-direction (perpendicular to the semiconductor substrate). A sensor device having two such IMC-structures spaced apart at a distance $\Delta x$ of about 1.0 mm to about 3.0 mm, allows to determine four magnetic field components Bx1, Bz1, Bx2, Bz2, from which two magnetic field gradients dBx/dx and dBz/dx can be derived. Depending on the application, these magnetic field values or these gradient values may be converted into a current, a linear or angular position, etc. in known manners. If one of the Hall elements is defective, however, one or more component values, and one or more gradient values may be incorrect, and thus also the current or position value derived therefrom, which is undesirable.

Figure 2:
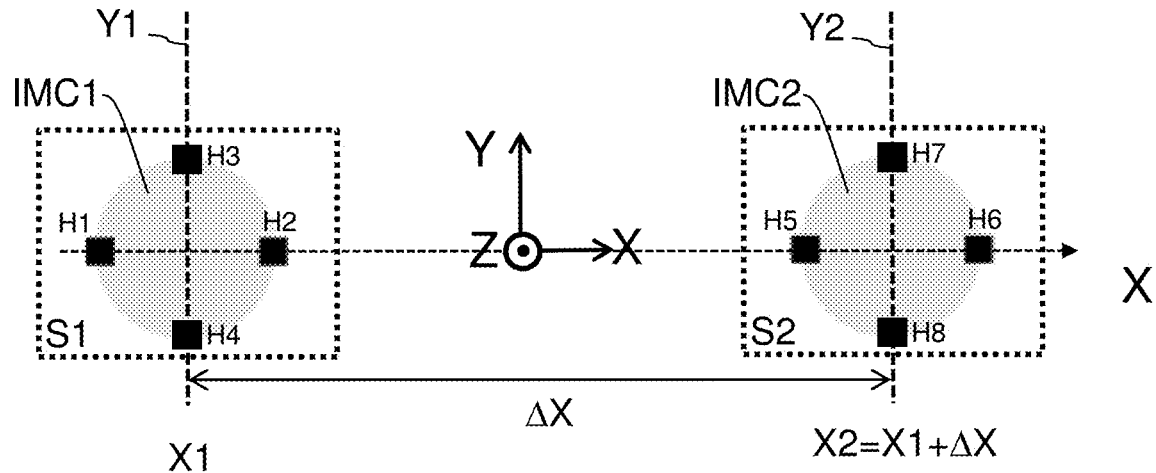
FIG. 2 is a schematic block-diagram of a sensor circuit known in the art, which is a variant of FIG. 1. This sensor circuit comprises a first sensor structure at a first location X1, and a second sensor structure at a second location X2 along an X-axis; each sensor structure comprises an integrated magnetic concentrator (IMC) and four horizontal Hall elements arranged at a periphery of the IMC.

FIG. 2 is a schematic block-diagram of another sensor circuit known in the art, which is a variant of FIG. 1. This sensor circuit comprises a first sensor structure situated at a first location X1, and a second sensor structure situated at a second location X2 along an X-axis, each sensor structure comprising an integrated magnetic concentrator (IMC) and four horizontal Hall elements arranged at a periphery of the IMC. Two of the horizontal Hall elements of each IMC are located on the X-axis, the other two horizontal Hall elements are arranged along an Y-axis perpendicular to the X-axis. Each of these IMC's with four horizontal Hall elements allows to measure three orthogonal magnetic field components Bx, By and Bz. A sensor device having two such IMC-structures spaced apart at a distance $\Delta x$ of about 1.0 mm to about 3.0 mm, allows to determine six magnetic field components Bx1, By1, Bz1, Bx2, By2, Bz2, from which three magnetic field gradients dBx/dx, dBy/dx and dBz/dx can be derived. Depending on the application, these magnetic field values or these gradient values may be converted into a current, a linear or angular position, etc. in known manners. If one of the Hall elements is defective, however, one or more component values, and one or more gradient values may be incorrect, and thus also the current or position value derived therefrom, which is undesirable.

The inventors of the present invention wanted to find a magnetic sensor device which is capable not only of measuring a magnetic field characteristic, e.g. a magnetic field component and/or a magnetic field gradient, but which is also capable of detecting an error, in particular an error related to proper functioning of the magnetic sensor elements themselves, and/or the biasing circuit and/or the readout circuit thereof.

Existing solutions typically address this problem at the system level, by duplicating the entire hardware chain, from the sensor, the biasing and readout circuit, optional demodulator circuit, analog-to-digital convertor (ADC), up to and including the processing circuit. Such a solution works, but is less compact, consumes more power, and is more expensive.

Figure 3A:
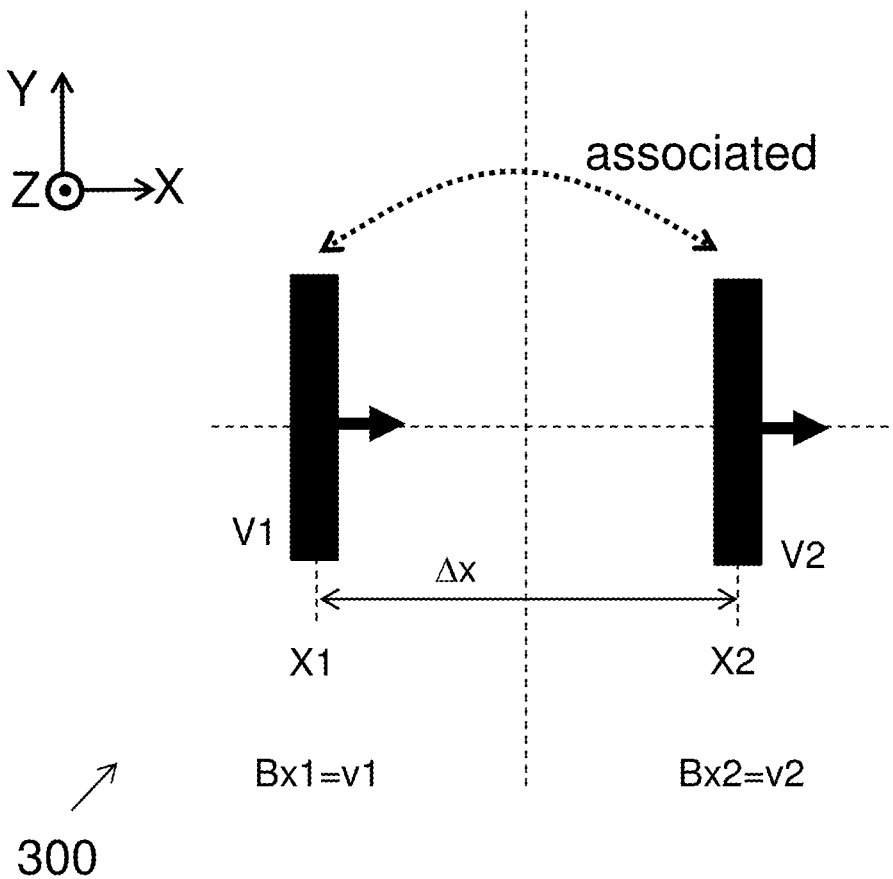
FIG. 3A and FIG. 3B is a schematic representation of a circuit comprising two vertical Hall elements.
Figure 3B:
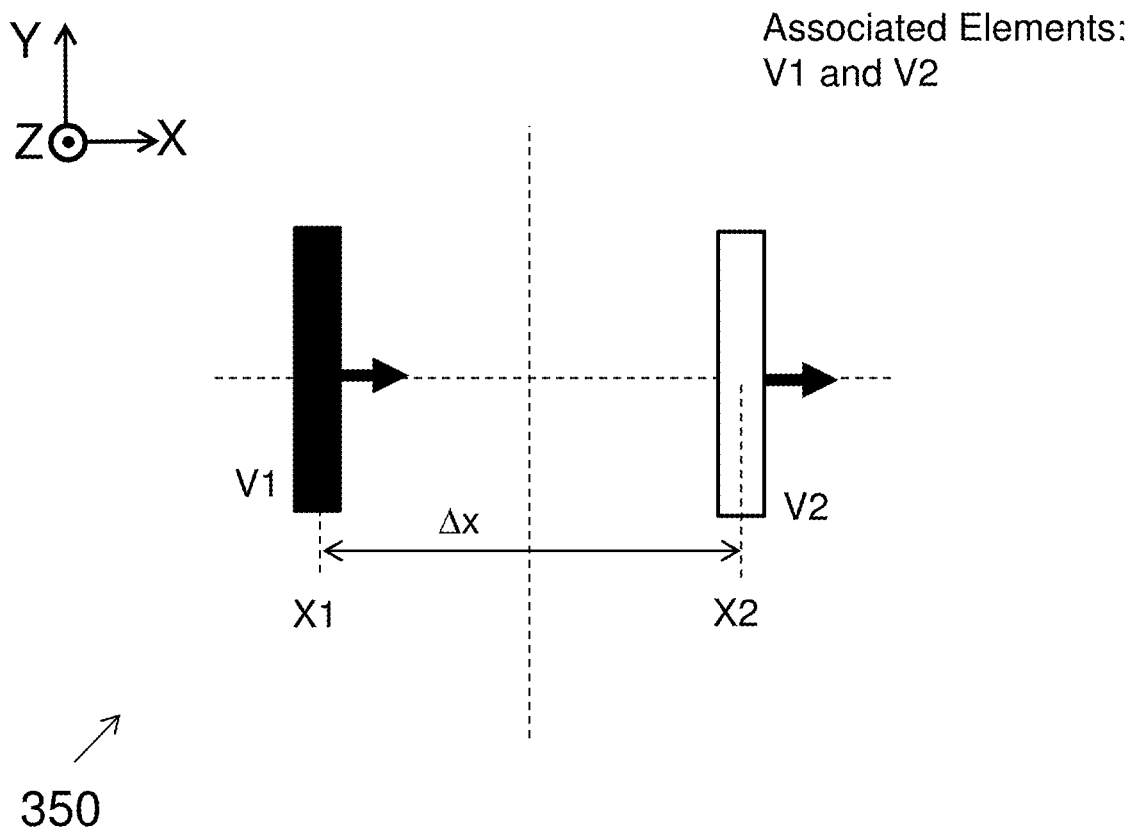

FIG. 3A and FIG. 3B is a schematic representation of a circuit comprising two vertical Hall elements V1, V2, each having an axis of maximum sensitivity oriented in the X-direction (as schematically indicated by a black arrow). Preferably the size and layout of these sensor elements is identical, but they are spaced from each other.

In a classical circuit, the sensor element V1 provides a signal v1 indicative for the magnetic field component Bx1, and the sensor element V2 provides a signal v2 indicative for the magnetic field component Bx2. As mentioned above, and in order to keep the description simple, scaling factors are omitted from this description, hence it can be written that Bx1=v1 and Bx2=v2. The value of v1 may be read using a first ADC (not shown), and the value of v2 may be read using a second ADC (not shown). In order to test if each of the vertical Hall elements is functioning correctly, one could compare the value of v1 and v2, and if they do not deviate more than a predefined threshold, it could be decided that the sensors are functioning correctly, and if they deviate more than said threshold, it could be decided that there is an error.

The inventors of the present invention, however, propose another readout-scheme, where in a first mode, (e.g. at a first moment in time), a combined signal of the two vertical Hall elements is measured, e.g. a linear combination of v1 and v2 using only positive coefficients different from zero, e.g. a sum, an average or a weighted average. Such a combined signal can be written mathematically as: combined=A*v1+ B*v2, where A and B are predefined constants larger than 0.0, for example A=1 and B=1 for a simple sum; or A=0.5 and B=0.5 for a simple average; or A=0.25 and B=0.75 as an example of a weighted average, and where in a second mode (e.g. at a second moment in time), one of the individual signals is measured, e.g. v1.

The inventors surprisingly found that a consistency check of the combined signal (e.g. v1+v2) and only one of the individual signals (e.g. v1), suffices to detect a defect of any of V1 and V2. This is counter-intuitive, because one would expect that in order to detect if V1 is functioning correctly, one would have to compare V1 with the combined signal, and in order to detect if V2 is functioning correctly, one would have to compare V2 with the combined signal, but the inventors found that is not required.

Indeed, suppose (case i) that during normal operation, V1 and V2 would both provide a correct signal V (e.g. a particular voltage or current), and suppose that the combined signal is implemented as a sum. In this case, the "combined signal" would be measured as 2V, and the individual signal would be measured as V, and the "combined signal" (2V) and the "individual signal" (V) are consistent because the sum should be approximately twice the individual value, within a predefined tolerance margin.

Suppose now (case ii) that V1 is functioning correctly and provides a correct value v1=V, but V2 is defective and provides an erroneous value v2=V+E (where E can be considered an error signal). In this case, the "combined signal" and the "individual signal" are not consistent, because the combined signal (2V+E) is usually not twice the signal v1 being (2V).

Suppose now (case iii) that V2 is functioning correctly and provides a correct value v2=V, but V1 is defective and provides an erroneous value v1=V+E. In this case, the "combined signal" and the "individual signal" are not consistent either, because the combined signal (2V+E) is usually not twice the signal v1 being (2V+2E).

Thus, a comparison of (v1) and the "combined signal" (e.g. v1+v2) allows to detect an error of any one of the elements V1 and V2, and the same applies for a comparison of (v2) and the "combined signal". Or stated in other words, only when both sensor elements V1 and V2 are functioning correctly, the "individual signal" (e.g. v1) and the "combined signal" (e.g. v1+v2) are consistent. This is one of the underlying principles of the present invention.

The associated elements V1 and V2 are preferably situated closely together, e.g. at a distance Δx smaller than 250 μm, or smaller than 150 μm, or smaller than 100 μm, thus measuring substantially the same magnetic field value in many applications.

In an embodiment, the combined signal is the sum of the signals v1 and v2, which may e.g. be implemented in hardware by (e.g. temporarily) connecting the differential outputs of the vertical Hall elements in series or in parallel, (e.g. depending on whether they are biased using a current source or a voltage source), or using an active circuit comprising an amplifier, or in any other way. If both Hall elements function correctly, the "sum signal" will have twice the amplitude of the individual signals and will thus have an improved signal to noise (SNR).

In another preferred embodiment, the combined signal is the average of v1 and v2, which may be implemented in hardware by (e.g. temporarily) connecting the vertical Hall elements in parallel or in series, or using an active circuit comprising an amplifier, or in any other way. If both Hall elements function correctly, this will typically reduce the internal resistance by a factor of two, which will reduce the noise, and thus also improve the SNR.

Figure 3C:
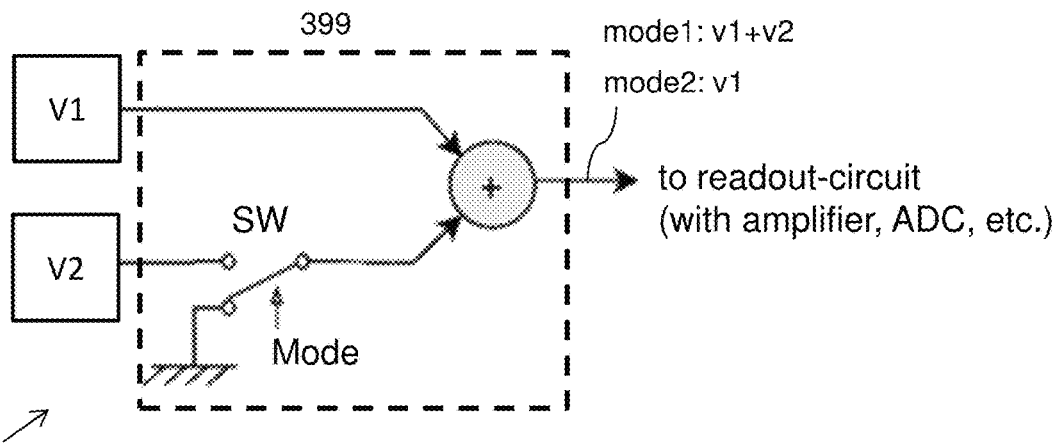
FIG. 3C is a schematic representation of an illustrative configurable interconnection circuit that may be used in conjunction with the sensor elements of FIG. 3A, and that allows to measure a combined signal when configured in a first mode (wherein the switch is closed), and which allows to measure only one individual signal when configured in a second mode (wherein the switch is open).

FIG. 3C is a schematic representation of an illustrative font-end 391, comprising the sensor elements V1, V2 of FIG. 3A, and a configurable interconnection circuit 399. The interconnection circuit shown in FIG. 3C comprises or consists of a switch (e.g. a MOSFET) and an "adder" or "averager", and routing. The addition or averaging may be implemented using one or more physical components or using a sub-circuit comprising an amplifier, for example, but that is not absolutely required, and the "addition" or "averaging" may also be performed passively, e.g. by connecting the output nodes of the two Hall elements V1, V2 in series or in parallel by means of one or more switches, e.g. MOSFET transistors.

As an example, the switch or switches may be arranged for selectively shorting the output nodes of a Hall element (or not), or may be arranged for selectively shorting the inputs of a differential amplifier, or may be arranged to selectively connect a node to a reference voltage (e.g. ground), or may be arranged for disconnecting one of the terminals of an amplifier, etc.

The interconnection circuit 399 can be regarded as a schematic or conceptual representation of such a circuit that allows to measure the "combined signal" (e.g. v 1+v2) when being configured in a first mode wherein the switch SW is closed; and allows to measure the "individual signal" (e.g. v1) when being configured in a second mode wherein the switch SW is open, but the present invention is not limited thereto, and the skilled reader can easily find a circuit that allow to measure the "combined signal" when the switch is open, and to measure the "individual signal" when the switch is closed.

Figure 3D:
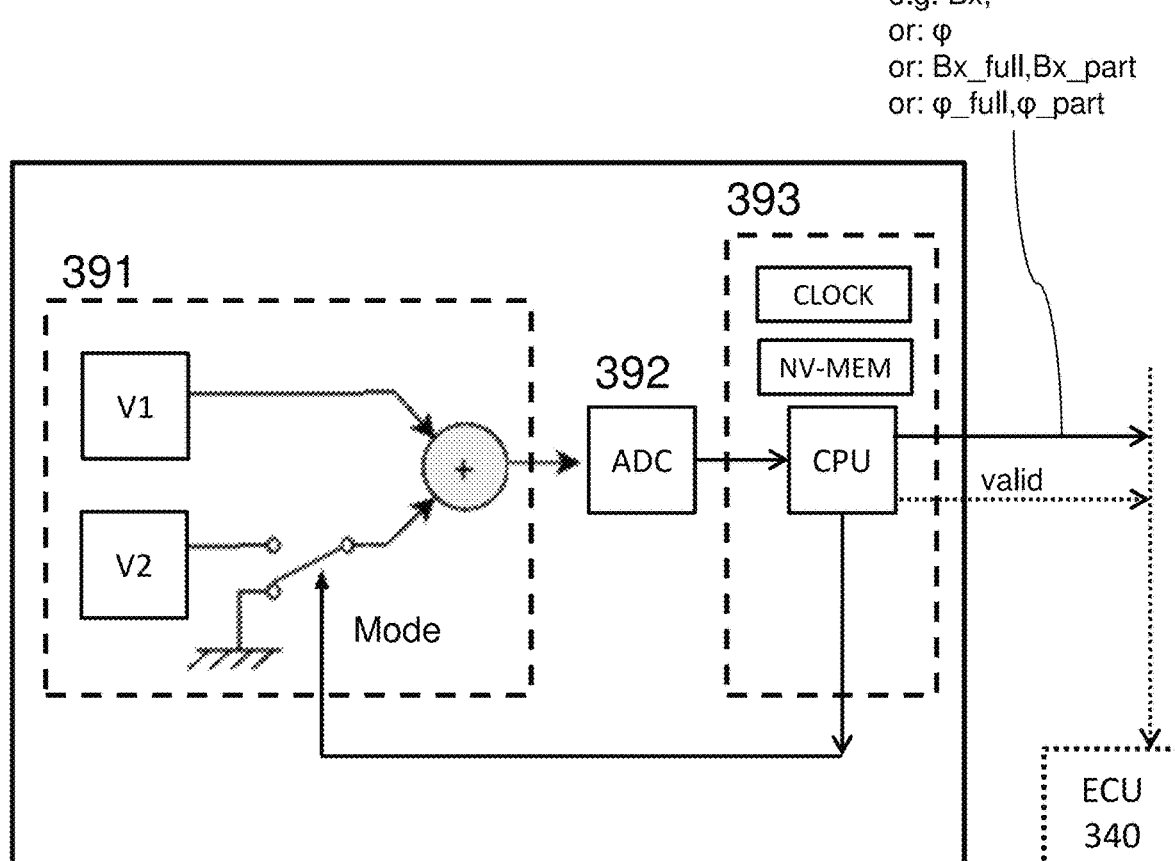
FIG. 3D is a schematic representation of a sensor device comprising the sensors of FIG. 3A and the interconnection circuit of FIG. 3C (together forming a "front-end"), and further comprising an analogue to digital converter (ADC) and a processing circuit with a programmable controller for selectively configuring the interconnection circuit in the first mode and obtaining data from the ADC (referred to as "combined signal"), and configuring the interconnection circuit in the second mode and obtaining data from the ADC (referred to as "individual signal").

FIG. 3D is a schematic representation of a sensor device 390 comprising the sensor elements V1, V2 of FIG. 3A, and the configurable interconnection circuit 399 of FIG. 3C, and further comprises an analogue to digital converter (ADC) 392 followed by a processing circuit 393 comprising a programmable controller CPU for obtaining a digitized version of the "combined signal" or a signal derived therefrom, and for obtaining a digital version of the "individual signal" or a signal derived therefrom, and adapted for configuring the switch of the interconnection circuit. The expression "or a signal derived therefrom" is not required for the sensor circuit of FIG. 3A, but will become clear further, e.g. when discussing FIG. 5C.

The sensor device may function as follows:

In a first mode, e.g. at a first moment in time, the CPU configures the interconnection circuit in a first mode by closing the switch SW, and measures and digitizes a combined signal, e.g. the sum or the average of v1 and v2. The "combined measurement" is schematically illustrated in FIG. 3A by colouring both sensor elements black, meaning the signals from the associated sensor elements V1 and V2 are pairwise combined, in this case the signals from V1 and V2. The processor would thus measure (v1+v2) which is a low-noise measurement of the magnetic field component Bx, denoted as Bx_full.

In a second mode, e.g. at a second moment in time, the CPU configures the interconnection circuit in a second mode by opening the switch SW, and measures and digitizes one of the individual signals, in the example of FIG. 3B, only the signal v1, which is schematically indicated by colouring V1 black, while leaving V2 white. The individual measured signal is denoted as Bx_part.

After measuring the combined signal Bx_full and the individual signal Bx_part, a consistency check of the "combined signal" and the "individual signal" can then be performed to detect an error. The outcome of the consistency test may then be output in the form of a validity signal, or an error signal.

The consistency test may be implemented in several ways. As an example, if the combined signal is a sum, the consistency check may test if $|Bx\_full - 2*Bx\_part| < \varepsilon$, where $| \ldots |$ means the absolute value of, and $\varepsilon$ is a predefined tolerance margin, and/or testing if a ratio of (Bx_full/Bx_part) is approximately equal to 2.00 within a predefined tolerance margin (e.g. ±10% or ±5% or ±2%), and/or testing if (Bx_part/Bx_full) is approximately equal to 0.50 within said tolerance margin. If the combined signal would be implemented as an average of v1 and v2 instead of a sum, the consistency check may comprise testing if $|Bx\_full - Bx\_part| < \varepsilon$, or testing if $(Bx\_avg/Bx\_part) \approx 1$, where $\approx$ means "is approximately equal to" within a predefined tolerance margin. A validity signal or error signal may be output, depending on the outcome of the consistency test.

The consistency check may be performed inside the sensor device 390 itself. In this case, the sensor device 390 may output the (low noise) combined signal Bx_full, as well as the validity signal or error signal. But the present invention is not limited thereto, and it is also possible that the consistency test is performed outside of the sensor device 390, for example by an external processor, e.g. by an electronic control unit (ECU) communicatively connected to the sensor device 390. In this case, in order to allow the consistency check to be performed outside of the sensor device, the sensor device 390 would need to output both the combined signal Bx_full as well as the individual signal Bx_part and does not have to perform the consistency check internally, although it may.

In a practical implementation, the switch SW may be operated periodically to alternatingly configure the interconnection circuit 399 in the first mode for measuring a combined signal, and in a second mode for measuring an individual signal. Depending on the application, however, it may not be required to perform a consistency check for each and every measurement, and it may suffice to test the consistency for example only once per two measurements, or only once per three measurements, or only once per ten measurements, or another fraction.

In FIG. 3A to FIG. 3D a very simple example of an embodiment of the present invention is shown, wherein the sensor device contains two vertical Hall elements V1, V2, each measuring a magnetic field component Bx, but of course the present invention is not limited to this example, and also works for other sensor devices having other sensor structures such as horizontal Hall elements, which may measure one or more magnetic field components and/or one or more magnetic field gradients, and which may calculate one or more angles derived from said components and/or gradients. The same principles as described above, can also be applied here, mutatis mutandis, which in its simplest form can be summarized as follows: i) measuring a "combined signal" by pairwise combining the signals from two associated sensor elements, e.g. by connecting two associated sensor elements in parallel or series; ii) measuring an "individual signal" by disconnecting said associated sensor elements; iii) outputting the combined measurement; and iv) performing a consistency check and outputting a validity signal or error signal. But as mentioned above, it is also possible to perform the consistency check outside the sensor device, in which case the sensor device may output the measurement of the combined signal and the measurement of the individual signal. But in case multiple magnetic field components are measured, the consistency check does not need to be performed on the actual measurements of the combined signals and individual signals themselves, but may be based on quantities derived from the measured signals, such as e.g. a comparison of magnetic field gradients, or based on a comparison of two angular values derived from the combined signal(s) and individual signal(s), as will be explained further. Such sensor devices may have a block-diagram similar to that of FIG. 3D, but it would comprise another front end 391 (see e.g. FIG. 4C), and the CPU would be configured for processing the signals differently (e.g. in accordance with the mathematical formulas shown in FIG. 4A and FIG. 4B, etc.) But other block-diagrams may be used as well. For example, the block-diagram of FIG. 3D shows only one ADC, but the present invention is not limited thereto, and the sensor device may comprise a plurality of ADCs. It is noted also that the signals derived from the combined signal(s) and from the individual signal(s) may be further processed in the analog domain (e.g. summation or subtraction) or in the digital domain (e.g. arctangent), or partially in the analog domain and partially in the digital domain. This is less relevant for the circuit of FIG. 3A but is more relevant for the circuits shown in FIG. 4A to FIG. 9A.

Figure 4A:
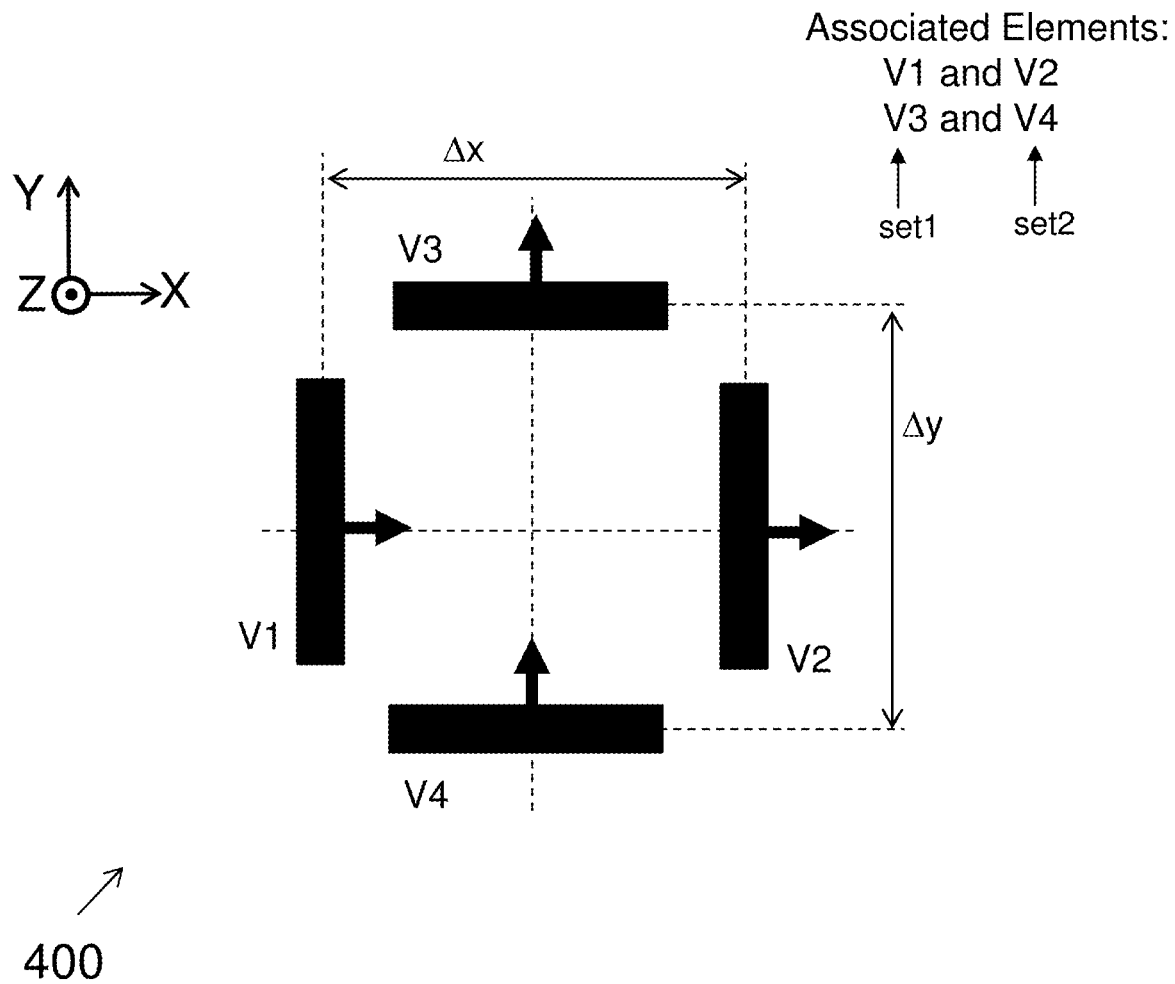
FIG. 4A and FIG. 4B is a schematic representation of a circuit comprising four vertical Hall elements.
Figure 4B:
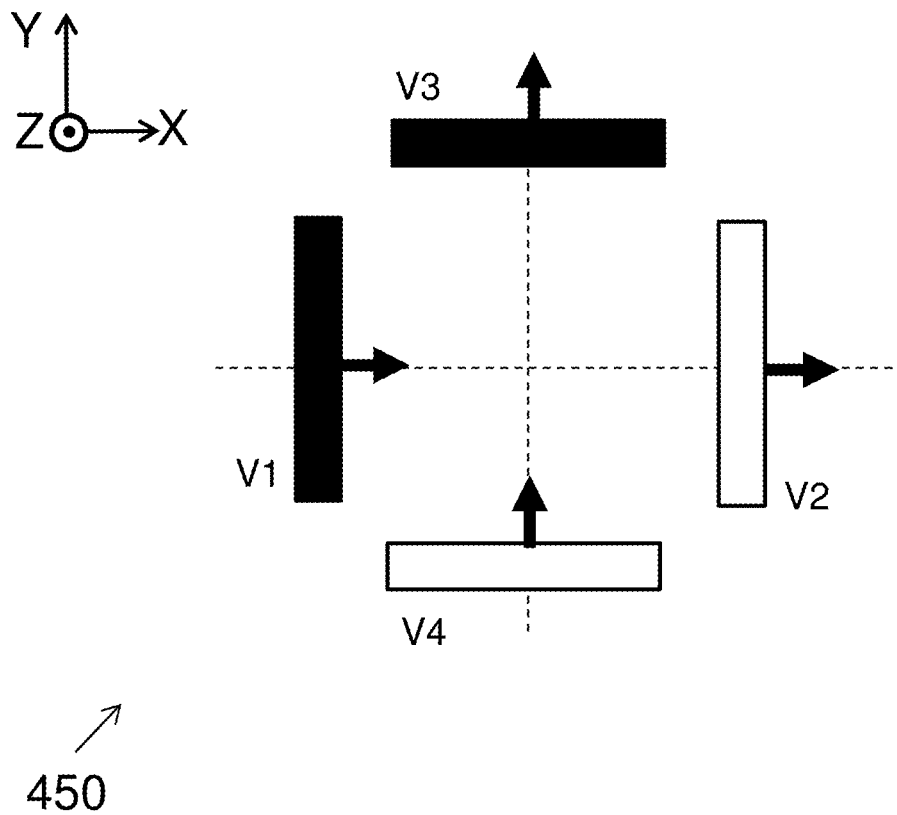

FIG. 4A and FIG. 4B is a schematic representation of a circuit 400 comprising four vertical Hall elements V1 to V4. This circuit is a variant of the circuit shown in FIG. 3A and FIG. 3B, and most of what has been explained above is also applicable here, mutatis mutandis. Only the main differences will be described.

As can be appreciated from FIG. 4A, two vertical Hall elements V1 and V2 have an axis of maximum sensitivity oriented in the X direction and form a first pair of associated sensor elements. The other two elements, namely V3 and V4 have an axis of maximum sensitivity oriented in the Y direction and form a second pair of associated sensor elements. The distance $\Delta x$ between V1 and V2, and the distance $\Delta y$ between V3 and V4 are preferably smaller than 250 μm, or smaller than 150 μm, or smaller than 100 μm.

FIG. 4A illustrates a first mode of operation, in which mode the signals from associated pairs are combined before being measured. In the example of FIG. 4A, the signals v1 and v2 originating from sensor elements V1 and V2 are combined, e.g. summed, and the sum (v1+v2) referred to herein as "Bx_full" is measured. Likewise, the signals v3 and v4 originating from sensor elements V3 and V4 are combined, e.g. summed, and the sum (v3+v4) referred to herein as "By_full" is measured. Depending on the implementation, the measurement of Bx_full and By_full may occur in parallel at the same time, in which case two ADCs are required, or may occur sequentially, in which case only one ADC is sufficient. Optionally an angular value φ_full may be calculated based on the two combined signals Bx_full and By_full, e.g. by calculating an arctangent of the ratio of the two combined signals.

FIG. 4B illustrates a second mode of operation (also referred to herein as the "diagnostics mode"). In this mode one individual signal of each associated pair (V1, V2) and (V3, V4) is measured. In the specific example of FIG. 4B, the individual signal v1 is measured for the associated sensor pair (V1, V2), and the individual signal v3 is measured for the associated sensor pair (V3, V4). The signal v1 is referred to herein as Bx_part, and the signal v3 is referred to as By_part. Again, depending on the implementation, the measurement of Bx_part and By_part may occur in parallel at the same time, or sequentially. Optionally an angular value φ_part may be calculated based on the two individual signals Bx_part and By_part, e.g. by calculating an arctangent of the ratio of the two individual signals.

Figure 4C:
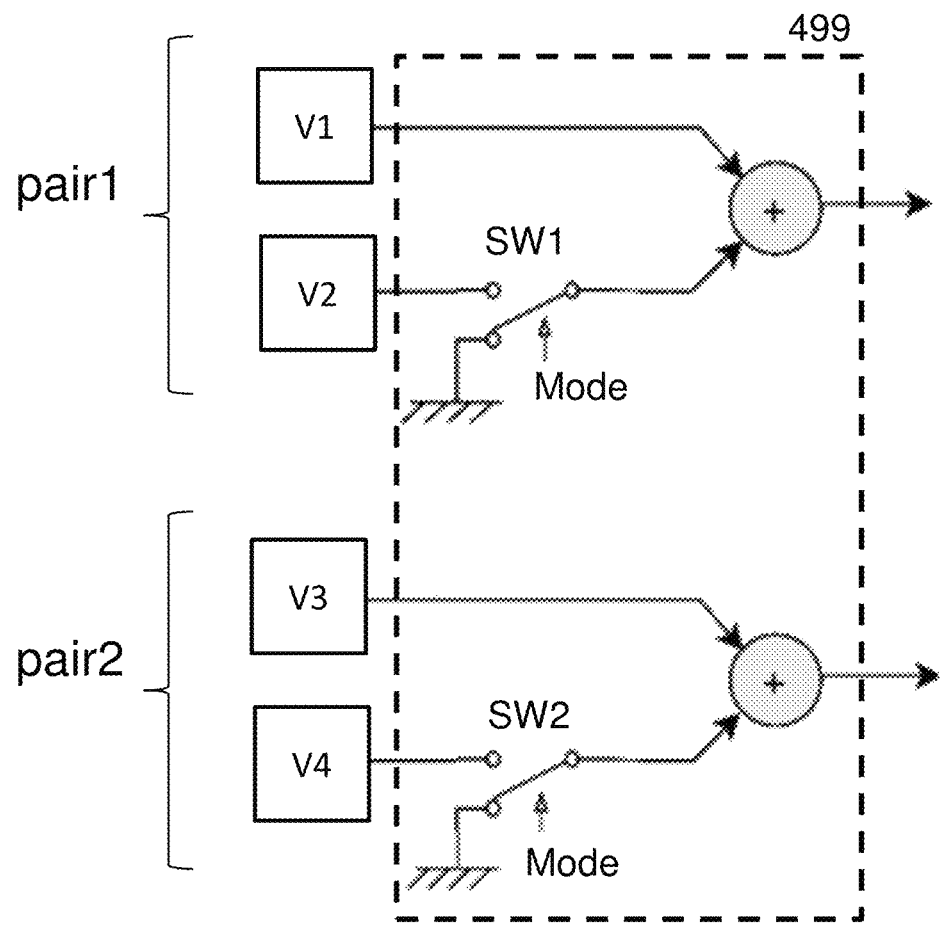
FIG. 4C is a schematic representation of an illustrative configurable interconnection circuit that may be used in conjunction with the sensor elements shown in FIG. 4A.

FIG. 4C is a schematic representation of a configurable interconnection circuit 499 that may be used in conjunction with the sensor elements V1 to V4 shown in FIG. 4A. As can be seen, in this case, the interconnection circuit 499 comprises two switches SW1, SW2, one for each pair of signals that need to be combined. The number of switches required for selectively measuring (in a first mode) the pairwise combined signals and (in a second mode) the individual signals as explained above, may be half the number of sensor elements. The interconnection circuit 499 further comprises two "adders" or "summators", but as already mentioned above, the summation or averaging or linear combination does not necessarily require an active component (e.g. an amplifier), but may be performed passively by connecting the differential outputs of the vertical Hall elements in series or in parallel.

As mentioned above, the consistency check may be performed inside the sensor device, or outside of the sensor device. Referring back to FIG. 4B, the consistency check may comprise: i) testing consistency of Bx_full and Bx_part, and testing consistency of By_full and By_part; or ii) testing consistency of φ_full and φ_part, e.g. by testing if these angular values are the same within a predefined tolerance margin of e.g. ±5°, or ±2° or ±1°. Depending on the application, any or all of the values Bx_full, Bx_part, By_full, By_part, φ_full, φ_part may be output. If the consistency check is performed inside the sensor device, it suffices to only output φ_full and the validity signal. But the consistency check may be performed outside the sensor device, e.g. by an external processor (e.g. an ECU), connected to the sensor device. If the consistency check is based on a comparison of the combined signals and the individual signals, the sensor device would have to output Bx_full, Bx_part, By_full, and By_part. If the consistency check is based on a comparison of the two angles φ_full and φ_part, the sensor device would have to output these angular values. Of course, it is also possible to perform a consistency check inside the sensor device and outside of the sensor device, by comparing the components and/or by comparing the angles. The skilled person having the benefit of the present disclosure, can easily select one of these options, e.g. depending on the available communication bandwidth, and/or the available functionality and processing power of the external processor (e.g. ECU).

For the sake of the description, the total number of sensor elements V1, V2, V3, V4 (N=4 in FIG. 4A) can be partitioned into a first set SET1 having N/2=2 sensor elements, containing V1 and V3, and a second set of two sensor elements V2 and V4. The first set SET1 of sensor elements are the elements whose outputs are used both in the first mode and the second mode of operation. These sensor elements are coloured black in FIG. 4B. The second set SET2 of sensor elements are the elements whose outputs are only used in the first mode of operation, but not in the second mode of operation. These sensor elements are coloured white in FIG. 4B. A good understanding of this partitioning may be helpful for a better understanding of the principles of the present invention, especially in the following Figures, having a relatively large number of sensor elements.

Figure 5A:
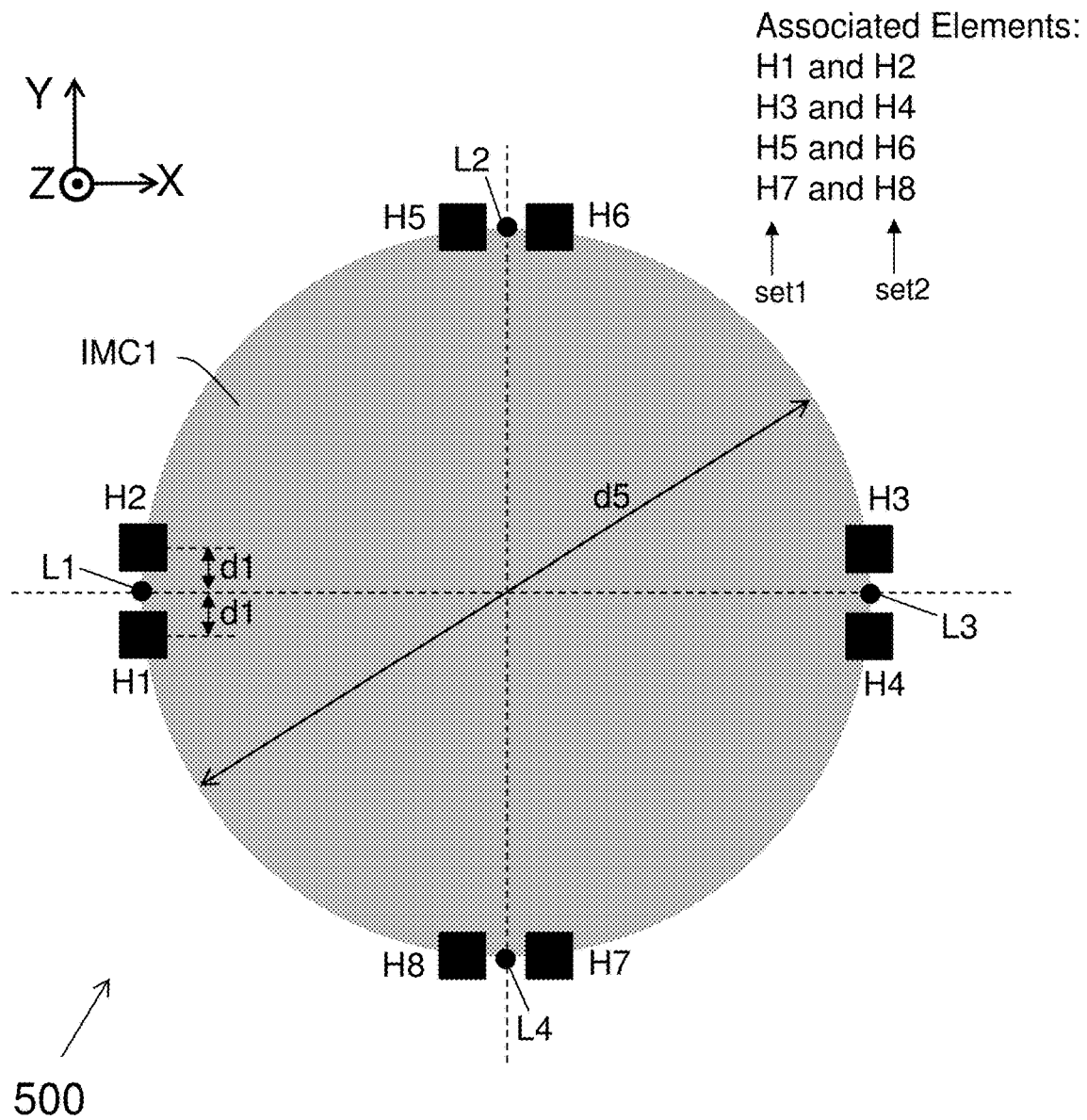

FIG. 5A and FIG. 5B is a schematic representation of a circuit 500 comprising an integrated magnetic concentrator IMC1 and eight horizontal Hall elements H1 to H8 arranged near the periphery of the IMC. The IMC may have a circular shape with a diameter d5 of about 150 to about 250 µm. The Hall elements may have a square shape with a length and width of about 15 to 25 µm. As can be seen, the eight horizontal Hall elements are not uniformly distributed around the periphery of the IMC, but they are arranged in four groups, each group comprising two horizontal Hall elements located closely together (e.g. at a distance smaller than 50 µm). The groups are situated on the periphery of the IMC, at the locations L1 to L4, indicated by black dots in FIG. 5A, and 90° spaced apart.

The adjacent Hall elements form four associated pairs. The odd numbered Hall elements H1, H3, H5 and H7 form a first set (set1) of sensor elements, and the even numbered Hall elements H2, H4, H6, H8 form a second set (set2) of sensor elements.

In a first mode of operation, four "combined signals" can be measured. In particular: the signals h1 and h2 are combined, and the combined signal (h1+h2) is measured, and the signals h3 and h4 are combined, and the combined signal (h3+h4) is measured, and the signals h5 and h6 are combined, and the combined signal (h5+h6) is measured, and the signals h7 and h8 are combined, and the combined signal (h7+h8) is measured.

Depending on the hardware implementation (e.g. the number of ADCs), the combined signals may be measured or captured all at the same time, but that is not absolutely required, and it is also possible to measure or capture the combined signals sequentially, in four steps, or in two steps of two combined signals.

From these "combined signals", other signals can be derived. For example, by subtracting the combined signals (h3+h4) and (h1+h2) in the analog or digital domain, a signal Bx_full can be generated. Likewise, by subtracting the combined signals (h5+h6) and (h7+h8) in the analog or digital domain, a signal By_full can be generated, and by adding the combined signals (h3+h4) and (h1+h2) in the analog or digital domain, a signal Bz_full can be generated. The signals Bx_full and By_full may be referred to as "first difference signals", where the word "first" refers to the first mode. The signal Bz_full may be referred to as a "first sum signal".

Optionally further signals or values can be derived from the first difference signals and/or the first sum signal. For example, a "first angular value" φxy_full can be calculated based on the "first difference" signals Bx_full and By_full, e.g. in accordance with the following formula: φxy_full=a tan 2(Bx_full,By_full). Another first angular value φxz_full can be calculated based on the first difference signal Bx_full and the first sum signal Bz_full, e.g. in accordance with the following formula: φxz_full=a tan 2(Bx_full,Bz_full).

FIG. 5B illustrates a second mode of operation, in which signals from the first set and the second set are not combined, but wherein individual signals from the horizontal Hall elements H1, H3, H5, H7 of the first set (set1) are measured individually. In the particular example of FIG. 5B, the following "individual signals" are measured in the second mode of operation: h1, h3, h5, h7. Similar as for the combined signals, these measurements may occur all at the same time, or consecutively, in multiple steps, e.g. in two steps or in four steps.

From these "individual signals" other signals can be derived. For example, by subtracting the individual signals (h3) and (h1) in the analog or digital domain, a signal Bx_part can be generated. Likewise, by subtracting the individual signals (h5) and (h7) in the analog or digital domain, a signal By_part can be generated. By adding the individual signals (h3) and (h1) in the analog or digital domain, a signal Bz_part can be generated. The brackets around the individual signals are used to show the similarity with the operations performed on the combined signals but using on the first term. The signals Bx_part and By_part may be referred to as "second difference signals", where the word "second" refers to the second mode. The signal Bz_part may be referred to as "second sum signal".

Optionally further signals or values can be derived from the second difference signals and/or the second sum signal. For example, a "second angular value" φxy_part can be calculated based on the "second difference" signals Bx_part and By_part, e.g. in accordance with the following formula: φxy_part=a tan 2(Bx_part,By_part). Another second angular value φxz_part can be calculated based on the second difference signal Bx_part and the second sum signal Bz_part, e.g. in accordance with the following formula: φxz_part=a tan 2(Bx_part,Bz_part).

Figure 5C:
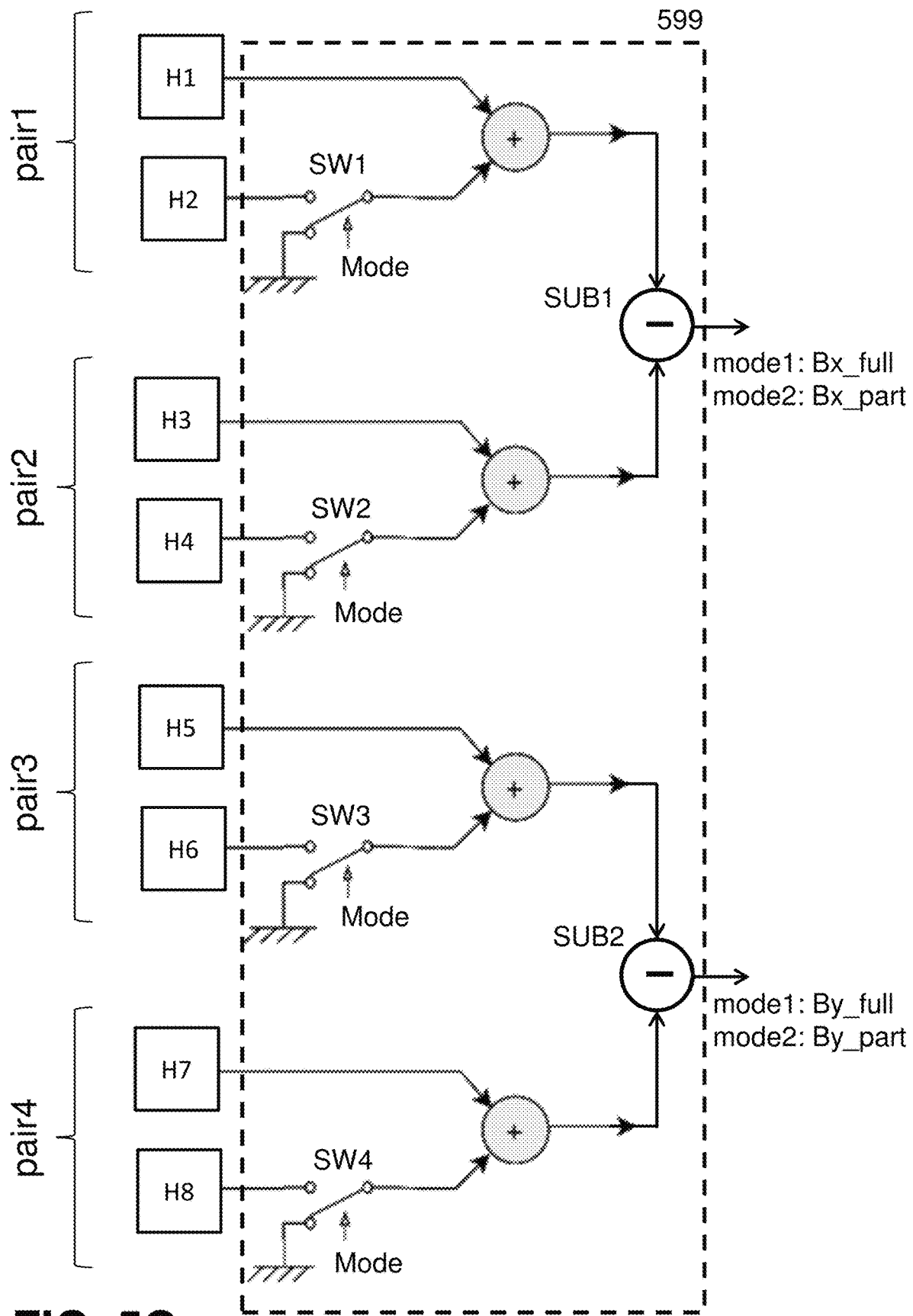
FIG. 5C is a schematic representation of an illustrative configurable interconnection circuit that may be used in conjunction with the sensor elements of FIG. 5A for selectively providing signals Bx_full and By_full (in mode1), and signals Bx_part and By_part (in mode2).

FIG. 5C is a schematic representation of an illustrative configurable interconnection circuit 599 that may be used in conjunction with the sensor structure shown in FIG. 5A. In the example shown, the first difference signals Bx_full, By_full and the second difference signals Bx_part, By_part are generated in the analog domain, using two subtraction circuits SUB1, SUB2. The outputs of these subtraction circuits may be input to an amplifier and ADC, etc.

In order to test correct functioning of the sensor device, or to detect an error, a consistency check may be performed by performing one or more of the following:
by comparing the "combined signals" and corresponding "individual signals", e.g. by testing if (h1+h2)≈(2*h1), and by testing if (h3+h4)≈(2*h3), etc.; and/or
by comparing the "first difference signals" and corresponding "second difference signals", e.g. by testing if Bx_full≈2*Bx_part, and by testing if By_full≈2*By_part; and/or
by comparing the first angle φxy_full and the corresponding second angle φxy_part, e.g. by testing if |φxy_full−φxy_part−ψ|<ε, where w is the angle shown in FIG. 5B, and ε is a predefined threshold (e.g. 5° or 2° or 1°), and/or by comparing φxz_full and φxz_part.

If the consistency test is performed inside the sensor device, a validity signal or an error signal is preferably output by the sensor device, and of course also one or more of the following signals Bx_full, By_full, Bz_full, φxy_full, φxz_full are output, depending on the application, preferably in digital form.

As mentioned above, it is also possible to perform the consistency check outside of the sensor device, in which case the values to be compared need to be output by the sensor device to an external processor (e.g. ECU), e.g. via a high-speed bus (e.g. a LAN bus), for allowing an external processor to perform the consistency check.

Figure 5D:
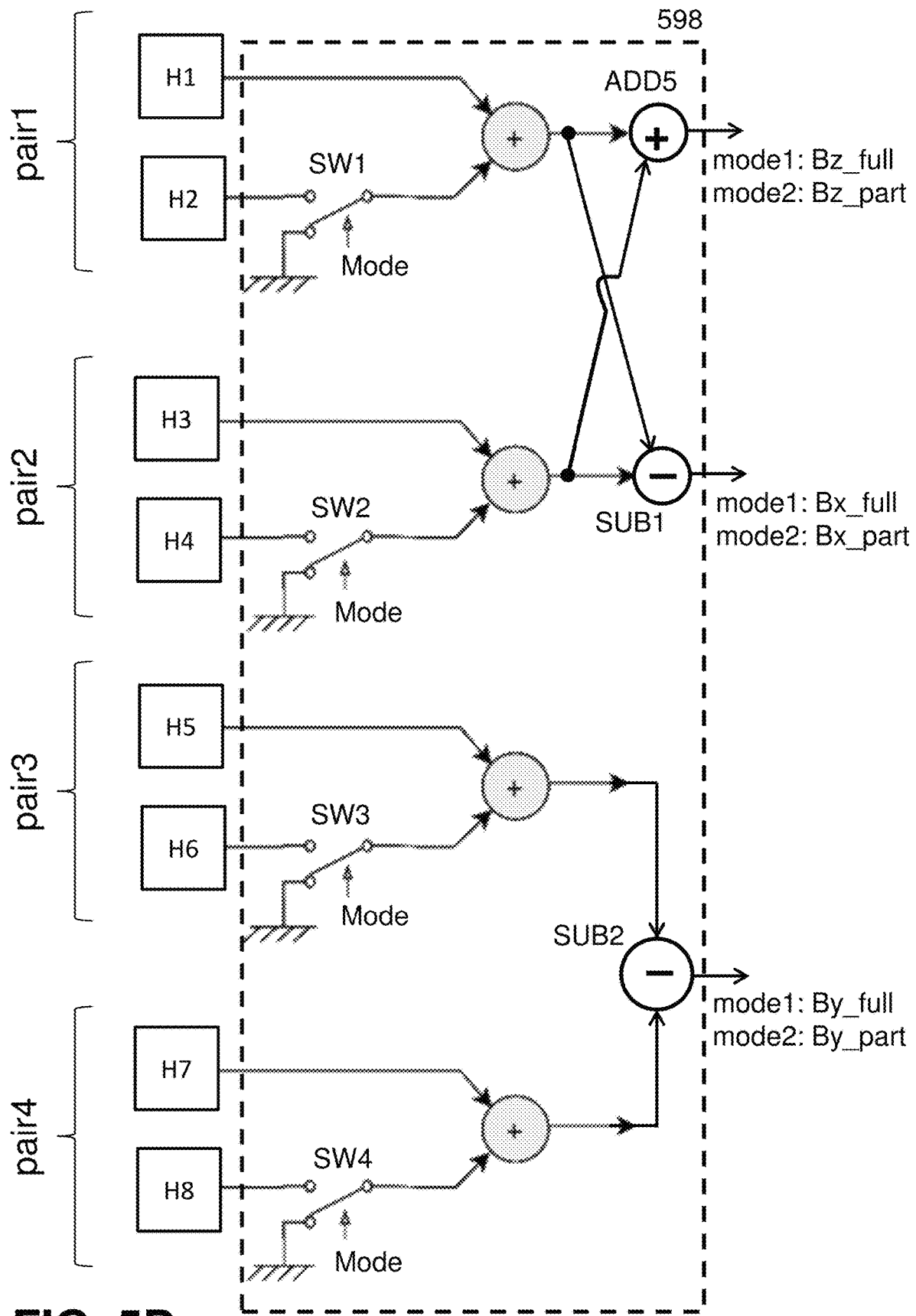
FIG. 5D shows another configurable interconnection circuit that may be used in conjunction with the sensor elements of FIG. 5A.

FIG. 5D is a schematic representation of another illustrative configurable interconnection circuit 598 that may be used in conjunction with the sensor structure shown in FIG. 5A. As can be seen, this circuit has an additional addition block ADDS. This interconnection circuit 598 allows to generate the first difference signals Bx_full, By_full, and the first sum signal Bz_full in the analog domain when in the first mode, and to generate the second difference signals Bx_part, By_part and the second sum signal Bz_part in the analog domain, when in the second mode.

As mentioned above, it is also possible to generate the derived signals in the digital domain, in which case the blocks SUB1, SUB2 and ADDS may be omitted.

While FIG. 5B may suggest that the sensor elements of each set have to be spaced apart by exactly 90°, and that the "black elements" (i.e. the elements measured in the second mode) have to be interleaved with the "white elements" (i.e. the elements not measured in the second mode), that is actually not required, and the present invention will also work if any of the individual sensor element is measured in the second mode and/or if the elements are spaced by an angle in the range from about 80° to about 100°, e.g. by using a less stringent consistency check.

Figure 6A:
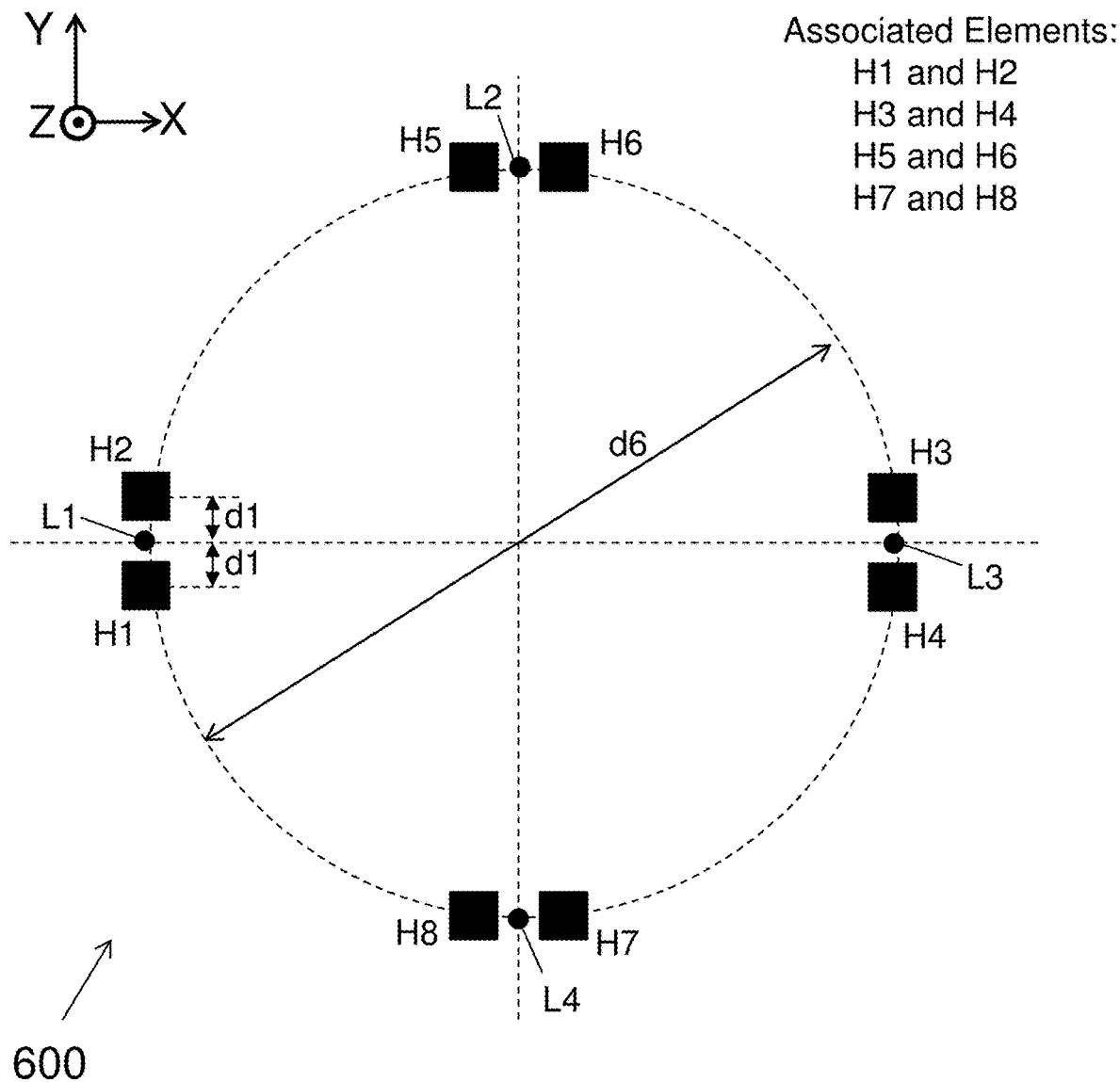
FIG. 6A and FIG. 6B is a schematic representation of a circuit comprising eight horizontal Hall elements arranged on an imaginary circle, but without IMC.
Figure 6B:
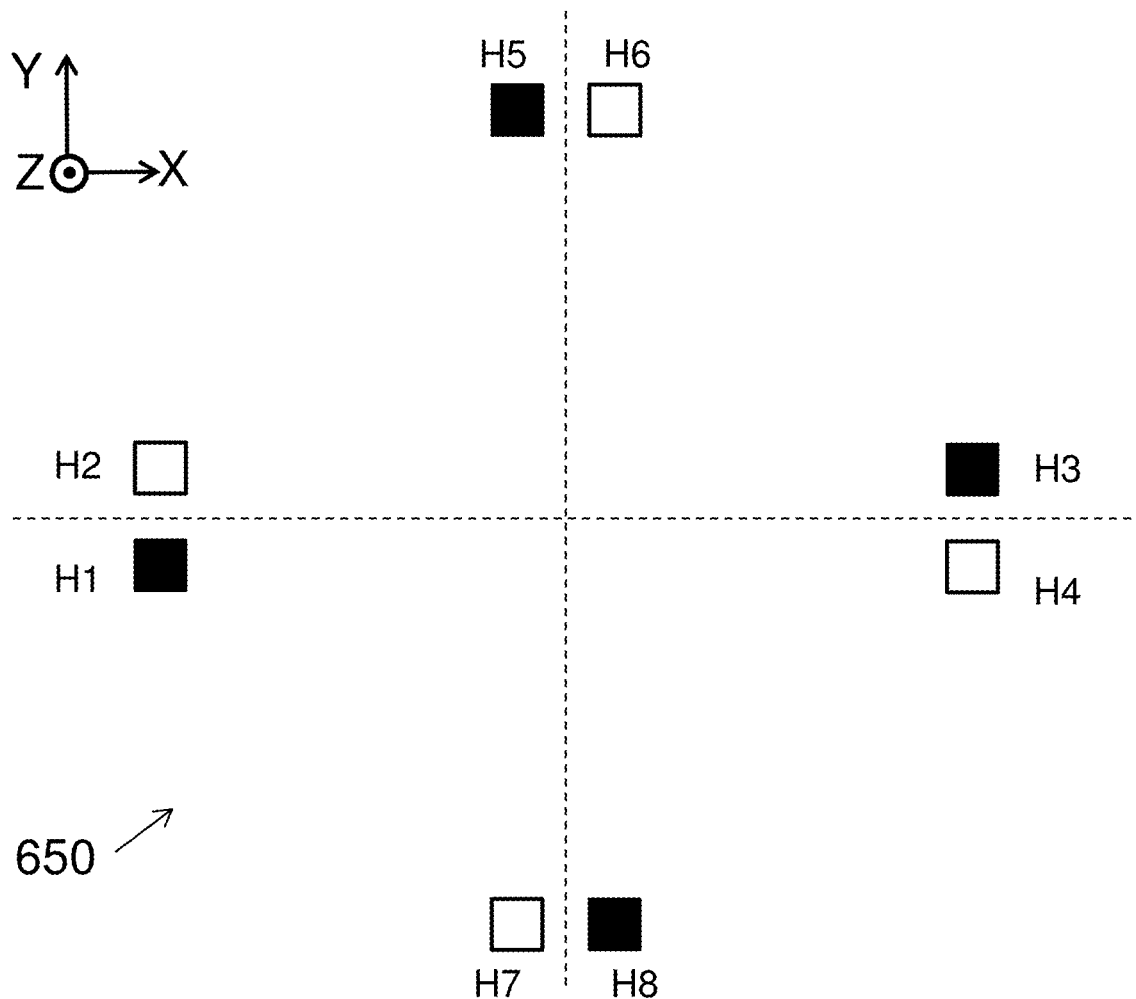

FIG. 6A and FIG. 6B is a schematic representation of a circuit 600 comprising eight horizontal Hall elements arranged on a virtual circle, but without an IMC or flux concentrator. FIG. 6A resembles FIG. 5A, but its dimensions are quite different, and it measures very different characteristics.

The diameter d6 of the virtual circle of FIG. 6A is typically a value in the range from about 1.5 mm to about 2.5 mm, which is typically a factor of 10 larger than the diameter d5 of FIG. 5A;
each of the sensor elements H1 to H8 of FIG. 6A measures a magnetic field component Bz oriented in the Z-direction perpendicular to the semiconductor substrate;
each of the combined signals (h1+h2), (h3+h4), (h5+h6) and (h7+h8) is proportional to the magnetic field component Bz that would be measured at the location L1, L3, L2 and L4;
the difference signal (h3+h4)−(h1+h2) represents a magnetic field gradient dB z/dx of the magnetic field component Bz along the X direction, and the difference signal (h5+h6)−(h7+h8) represents a magnetic field gradient dBz/dy of the magnetic field component Bz along the Y direction;
and the angular value φ_full of FIG. 6A is based on magnetic field gradients, which is highly insensitive to an external disturbance field.

Despite these differences, the same principles as described above, in order to detect an error, can also be applied, mutatis mutandis.

FIG. 6A illustrates a first mode of operation, wherein signals from associated elements are combined, and the "combined signals" are measured. Two first difference signals dBz/dx_full and dBz/dy_full may be derived from these combined signals, in the analog domain or in the digital domain, and an angular value φ_full may be calculated based on these first difference signals.

FIG. 6B illustrates a second mode of operation, wherein "individual signals" h1, h3, h5, h7 are measured, and two "second difference signals" dBz/dx_part and dBz/dy_part may be derived from these individual signals, in the analog domain or in the digital domain, and an angular value φ_part may be calculated based on these second difference signals.

In the same way as in FIG. 5A, a consistency check may be performed by comparing corresponding "combined signals" and "individual signals", and/or by comparing corresponding "first difference signals" and "second difference signals", and/or by comparing the first angular value φ_full and the second angular value φ_part. If a consistency test is performed inside the sensor device, a validity signal or an error signal is preferably output by the sensor device, and also one or more of the following signals dBz/dx_full, dBz/dy_full, φ_full are output, preferably in digital form. For example, the consistency check of FIG. 6B may:
  i) compare combined signals and corresponding individual signals:
    compare (h2+h1) and (h1), compare (h3+h4) and (h3)
    compare (h5+h6) and (h5), compare (h7+h8) and (h7)
  and/or ii) compare gradients:
    compare dBz/dx_full with dBz/dx_part
    compare dBz/dy_full with dBz/dy_part
  and/or iii) compare angles:
    compare φ_full and φ_part.

As mentioned above, it is also possible to perform a consistency check outside of the sensor device, in which case the values to be compared are output by the sensor device to an external processor (e.g. ECU), e.g. via a high-speed bus (e.g. a LAN bus), for allowing the external processor to perform the consistency check.

For completeness it is mentioned that the sensor device of FIG. 6A and FIG. 6B will also work if the horizontal Hall elements of FIG. 6A and FIG. 6B are not located on a single imaginary circle, but if, for example H1, H3, H5 and H7 are located on a first circle with a first radius R1, and if the elements H2, H4, H6, H8 are located on a second circle with a radius R2 slightly larger or slightly smaller than R1. It suffices that each of the elements H2, H4, H6, H8 are arranged in close proximity (e.g. at a distance smaller than 80 μm) from its associated element H1, H3, H5, H7 respectively.

And for completeness it is mentioned that also in the embodiment of FIG. 6B, the invention will still work if any element within a pair is selected as the individual element; they don't need to be alternatingly arranged as shown in FIG. 6B. In fact, it is not even required to always measure the same individual signal in the second mode, but it may be easier to implement.

Figure 7A:
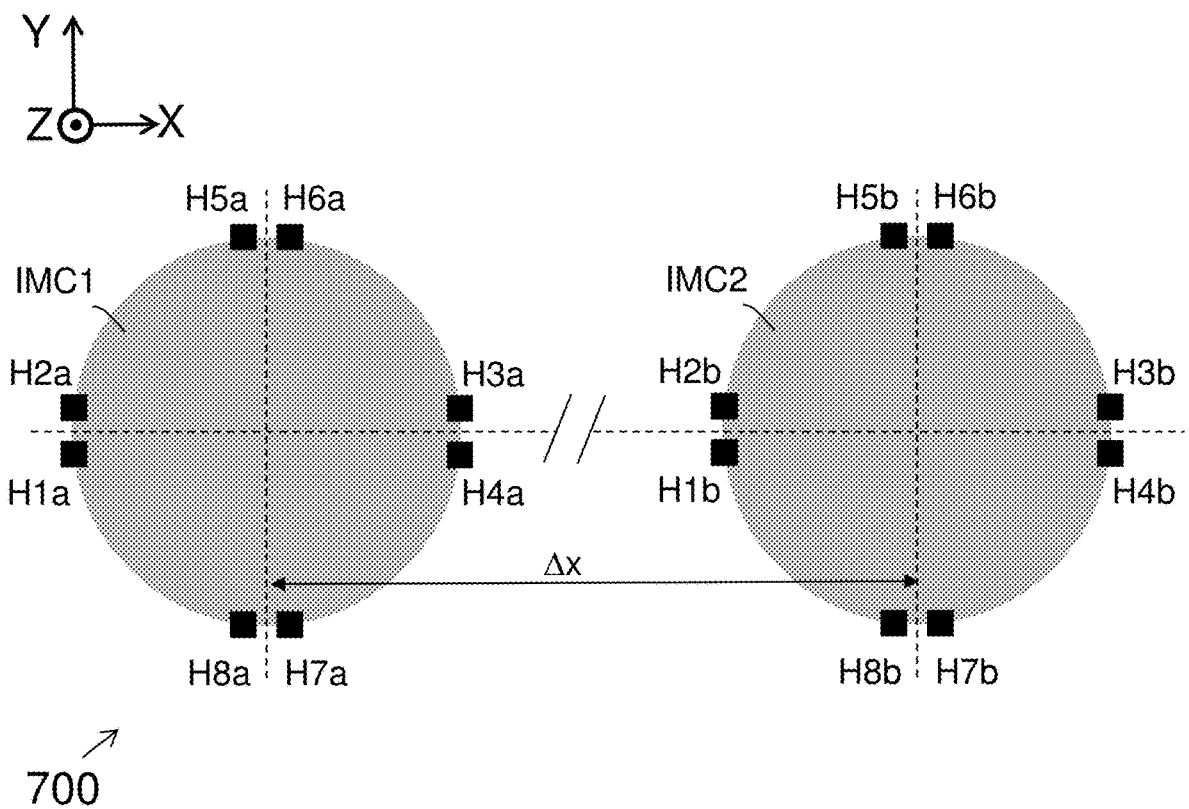
FIG. 7A and FIG. 7B is a schematic representation of a circuit comprising two sensor structures as illustrated in FIG. 5A, spaced apart over a predefined distance $\Delta X$.
Figure 7B:
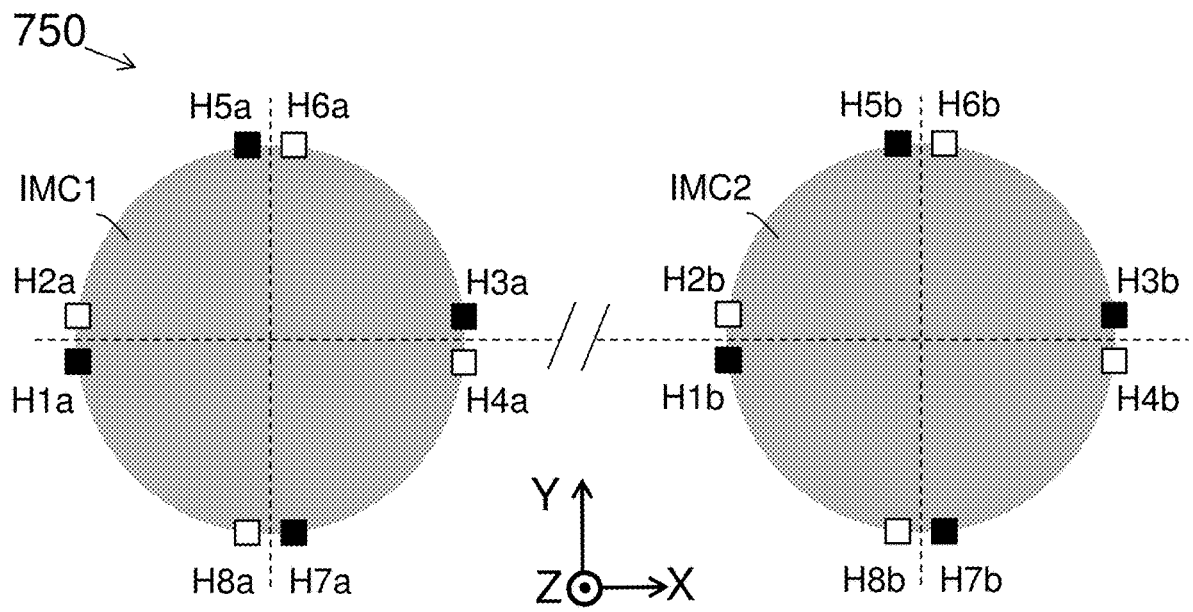

FIG. 7A and FIG. 7B is a schematic representation of a circuit 700 comprising two sensor structures as illustrated in FIG. 5A, spaced apart over a predefined distance Δx (e.g. in the range from 1.0 mm to 3.0 mm, or from 1.5 to 2.5 mm).

FIG. 7A illustrates a first mode of operation. In this mode, a plurality of "combined signals" can be measured, namely: (h1a+h2a), (h3a+h4a), (h5a+h6a), (h7a+h8a), (h1b+h2b), (h3b+h4b), (h5b+h6b), (h7b+h8b). From these "combined signals", four "first difference signals" and two "first sum signals" can be derived, namely one or more of:

$Bxa\_\text{full} = (h3a+h4a)-(h1a+h2a)$ $Bya\_\text{full} = (h5a+h6a)-(h7a+h8a)$ $Bxb\_\text{full} = (h3b+h4b)-(h1b+h2b)$ $Byb\_\text{full} = (h5b+h6b)-(h7b+h8b)$ $Bza\_\text{full} = (h1a+h2a)+(h3a+h4a)$ $Bzb\_\text{full} = (h1b+h2b)+(h3b+h4b)$ for example in the analog domain, using two interconnection circuits similar to that of FIG. 5D, or in the digital domain.

It is possible to derive further signals from these "first difference signals" and "first sum signals", e.g. three "first magnetic field gradients" may be calculated using one or more of the formulas:

$dBx/dx\_\text{full} = Bxb\_\text{full} - Bxa\_\text{full}$ $dBy/dx\_\text{full} = Byb\_\text{full} - Bya\_\text{full}$ $dBz/dx\_\text{full} = Bzb\_\text{full} - Bza\_\text{full}$ and one or more "first angular values" may be derived from these gradient signals, e.g. using one or more of the following formulas:

$\varphi xz\_\text{full} = a\tan 2(dBx/dx\_\text{full}, dBz/dx\_\text{full})$ $\varphi xy\_\text{full} = a\tan 2(dBx/dx\_\text{full}, dBy/dx\_\text{full})$ $\varphi yz\_\text{full} = a\tan 2(dBy/dx\_\text{full}, dBz/dx\_\text{full})$.

It is an advantage that these angular values are highly insensitive to an external disturbance field.

FIG. 7B illustrates a second mode of operation. In this mode, a plurality of "individual signals" can be measured, namely: (h1a), (h3a), (h5a), (h7a), (h1b), (h3b), (h5b), and (h7b). From these "individual signals", four "second difference signals" and two "second sum signals" can be derived, namely one or more of:

$Bxa\_\text{part} = (h3a)-(h1a)$ $Bya\_\text{part} = (h5a)-(h7a)$ $Bxb\_\text{part} = (h3b)-(h1b)$ $Byb\_\text{part} = (h5b)-(h7b)$ $Bza\_\text{part} = (h1a)+(h3a)$ $Bzb\_\text{part} = (h1b)+(h3b)$ for example in the analog domain, using two interconnection circuits similar to that of FIG. 5D, or in the digital domain.

It is possible to derive further signals from these "second difference signals" and "second sum signals", e.g. three "second magnetic field gradients" may be determined in the analog or digital domain, in accordance with one or more of the formulas:

$dBx/dx\_\text{part} = Bxb\_\text{part} - Bxa\_\text{part}$ $dBy/dx\_\text{part} = Byb\_\text{part} - Bya\_\text{part}$ $dBz/dx\_\text{part} = Bzb\_\text{part} - Bza\_\text{part}$, and one or more "second angular values" can be derived from these "second gradient signals", preferably in the digital domain, e.g. using one or more of the following formulas:

$\varphi xz\_\text{part} = a\tan 2(dBx/dx\_\text{part}, dBz/dx\_\text{part})$ $\varphi xy\_\text{part} = a\tan 2(dBx/dx\_\text{part}, dBy/dx\_\text{part})$ $\varphi yz\_\text{part} = a\tan 2(dBy/dx\_\text{part}, dBz/dx\_\text{part})$.

It is an advantage that also these angular values are highly insensitive to an external disturbance field.

In the similar way as in FIG. 5A, a consistency check may then be performed by comparing corresponding "combined signals" and "individual signals", and/or by comparing corresponding "first difference signals" and "second difference signals" (in the example of FIG. 7 representing magnetic field components), and/or by comparing corresponding magnetic field gradients, and/or by comparing corresponding first angular values and second angular values. For example, the consistency check of FIG. 7B may:
  i) compare combined signals and corresponding individual signals, e.g.:
    compare (h2a+h1a) and (h1a), etc.
  and/or ii) compare components:
    Bxa_full and Bxa_part, Bxb_full and Bxb_part; Bya_full and Bya_part, Byb_full and Byb_part; Bza_full and Bza_part, Bzb_full and Bzb_part;
  and/or iii) compare gradients:
    compare dBx/dx_full and dBx/dx_part;
    compare dBy/dx_full and dBy/dx_part;
    compare dBz/dx_full with dBz/dx_part;
  and/or iv) compare angles:
    compare φxz_full and φxz_part
    compare φxy_full and φxy_part
    compare φyz_full and φyz part.

If a consistency test is performed inside the sensor device, a validity signal or an error signal is preferably output by the sensor device, and for example also one or more of the combined signals, or signals derived from the combined signals, e.g. one or more component signals, and/or one or more gradient signals, and/or one or more angular values, preferably in digital form.

As mentioned above, it is also possible to perform the consistency check outside of the sensor device, in which case the values to be compared are output by the sensor device to an external processor (e.g. ECU), e.g. via a high-speed bus (e.g. a LAN bus), for allowing an external processor to perform the consistency check.

In a variant (not shown) of FIG. 7A and FIG. 7B, each of the first and sensor structure may comprise a horizontal Hall element surrounded by four vertical Hall elements, two having an axis of maximum sensitivity oriented in the X-direction, and two having an axis of maximum sensitivity oriented in the Y-direction, e.g. in a manner similar as shown in FIG. 4A and FIG. 4B but with the addition of a horizontal Hall element in the centre. Each of these sensor structures is capable of measuring three magnetic field components: Bx, By, Bz, (albeit using different formulas), and it is also possible to calculate up to three magnetic field gradients, and to calculate up to three angles. Thus, the same principles apply also for this embodiment.

Figure 8A:
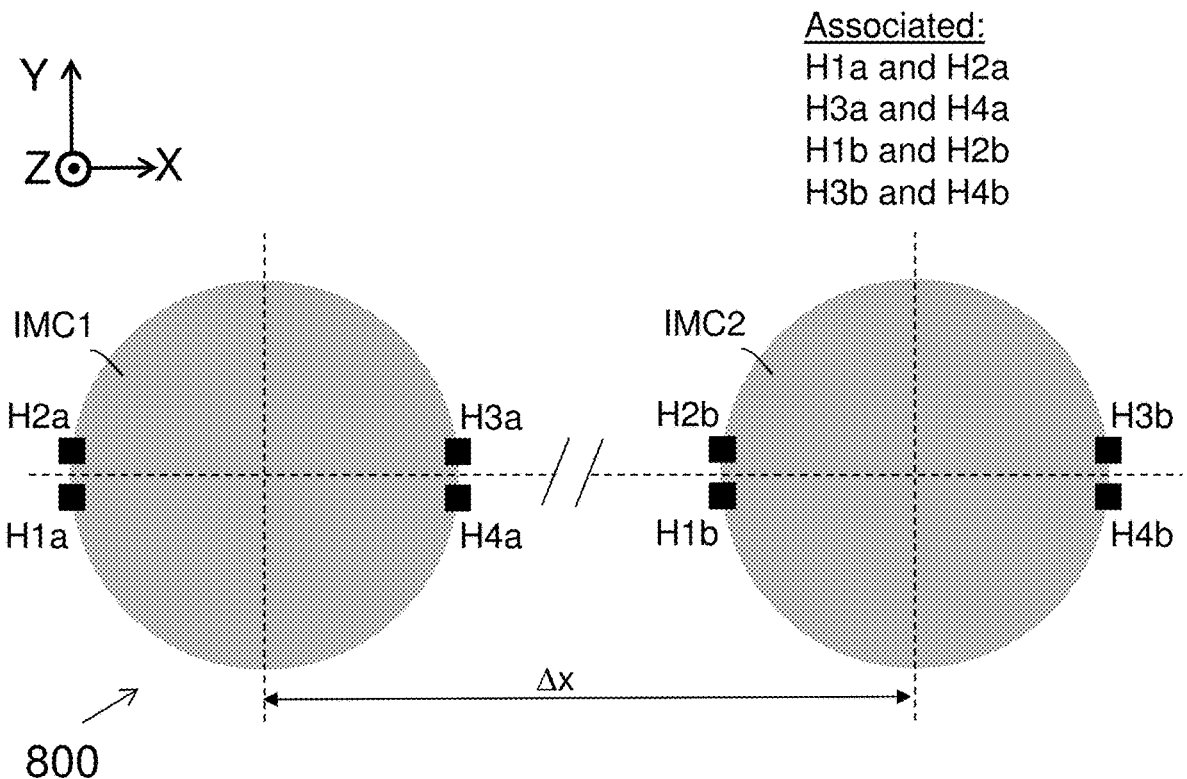
FIG. 8A and FIG. 8B is a schematic representation of a circuit similar to that of FIG. 7A and FIG. 7B, having two IMC disks, but only four horizontal Hall elements at the periphery of each IMC.
Figure 8B:
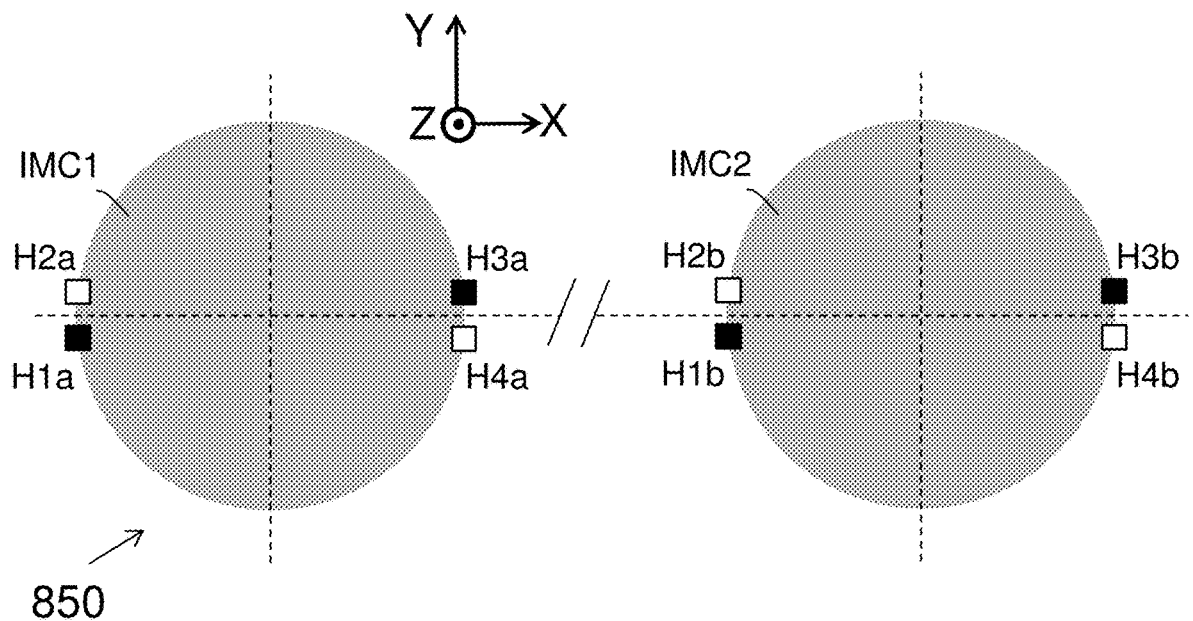

FIG. 8A and FIG. 8B is a schematic representation of a circuit 800 similar to that of FIG. 7A and FIG. 7B, also having two circular IMC disks, but there are only four horizontal Hall elements at the periphery of each IMC disks instead of eight. FIG. 8A illustrates a first mode of operation, and FIG. 8B illustrates a second mode of operation. The signals shown in FIG. 8A and FIG. 8B are a subset of the signals shown in FIG. 7A and FIG. 7B respectively, but the principles of operation are the same. For example, the consistency check of FIG. 8B may:
  i) compare combined signals and corresponding individual signals, e.g.:
    compare (h2a+h1a) and (h1a), etc.
  and/or ii) compare components:
    Bxa_full and Bxa_part, Bxb_full and Bxb_part;
    Bza_full and Bza_part, Bzb_full and Bzb_part;
  and/or iii) compare gradients:
    compare dBx/dx_full and dBx/dx_part;
    compare dBz/dx_full with dB z/dx_part;
  and/or iv) compare angles:
    compare φ_full and φ_part.
Hence, no further explanation is required.

In a variant (not shown) of FIG. 8A and FIG. 8B, each of the first and sensor structure may comprise a horizontal Hall element situated between two vertical Hall elements, each having an axis of maximum sensitivity oriented in the X-direction, e.g. in a manner similar as shown in FIG. 3A and FIG. 3B but with the addition of a horizontal Hall element in between. Each sensor structure is capable of measuring two magnetic field components: Bx, Bz, (albeit using different formulas), and it is also possible to calculate up to two magnetic field gradients, from which gradients an angle can be calculated. The same principles apply also for this embodiment, mutatis mutandis.

In a further variant (not shown), the two vertical Hall elements are not arranged as shown in FIG. 3A and FIG. 3B for measuring a Bx-component but are arranged for measuring a By-component. In this case, each structure would be capable of measuring By and Bz, from which two magnetic field gradients dBy/dx and dBz/dx can be derived, from which gradients an angle can be derived. The same principles apply also for this embodiment, mutatis mutandis.

Figure 9A:
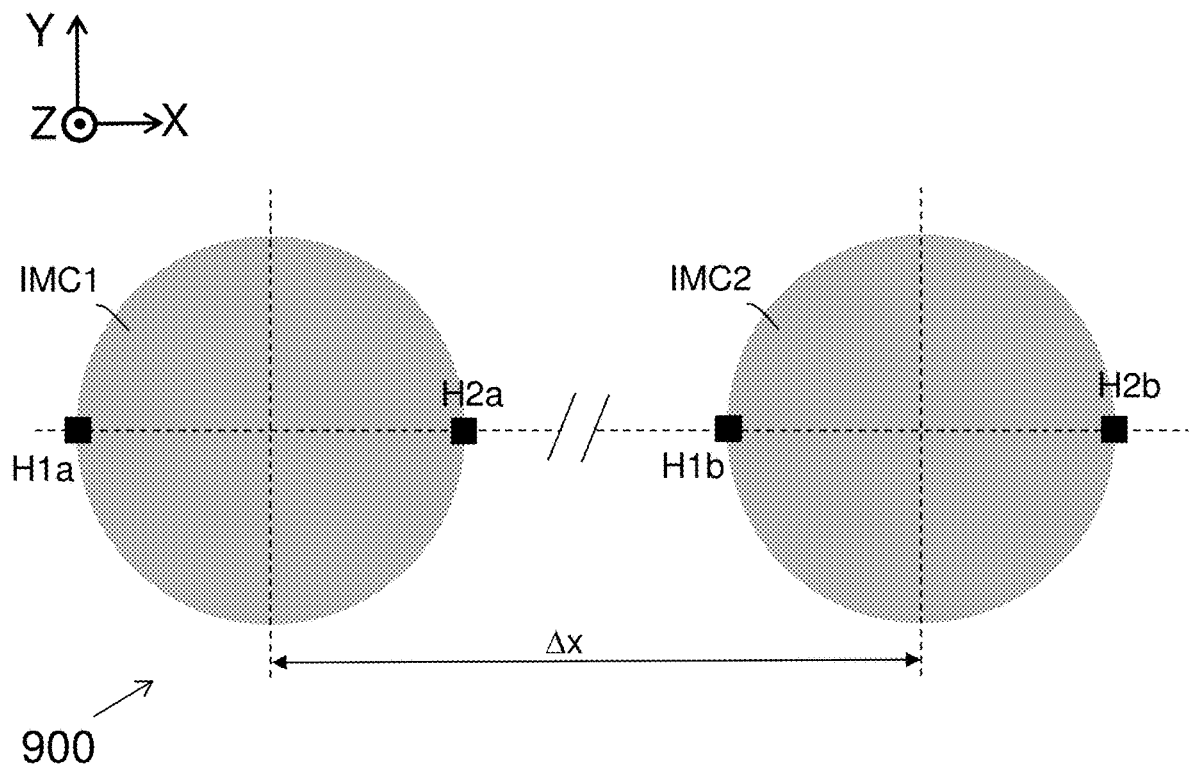
FIG. 9A and FIG. 9B is a schematic representation of a circuit similar to that of FIG. 1, having two IMC disks, and only two horizontal Hall elements at the periphery of each IMC.
Figure 9B:
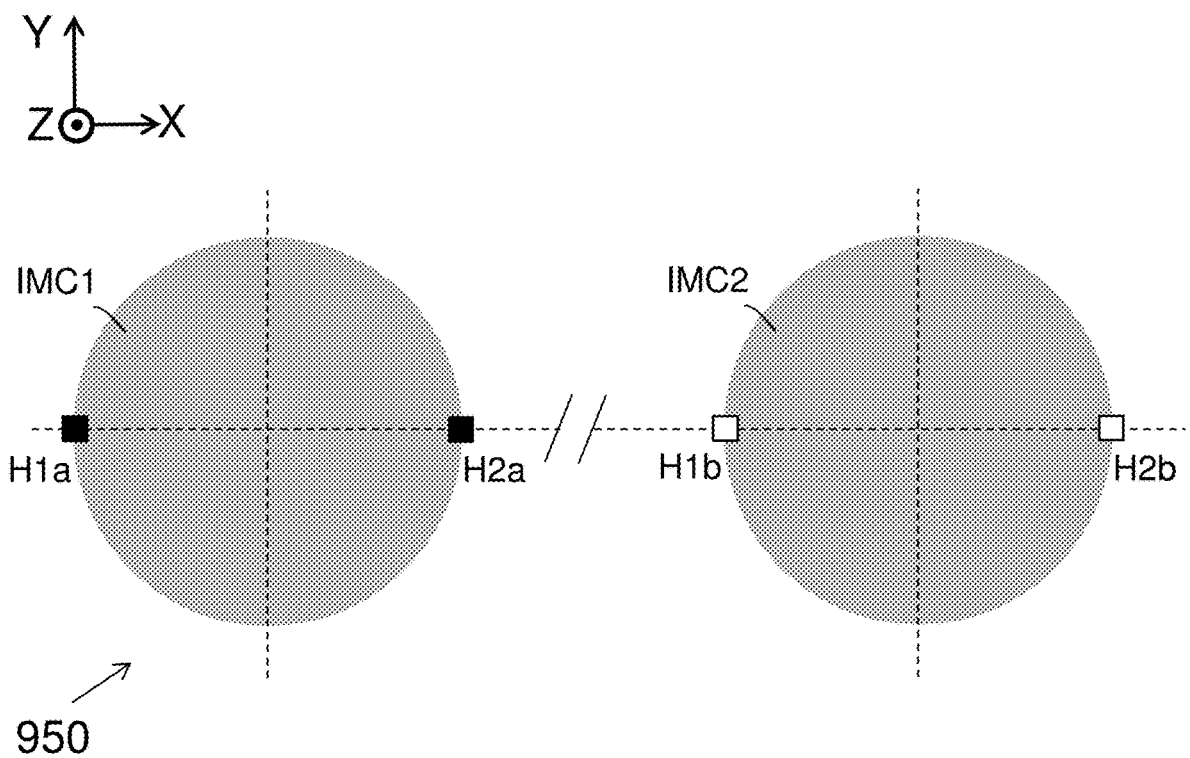

FIG. 9A and FIG. 9B is a schematic representation of a circuit that at first sight looks similar to that of FIG. 1, because it also has two IMC disks which are spaced apart by a distance Δx of about 1.0 mm to 3.0 mm, or 1.5 mm to 2.5 mm, and there are also two horizontal Hall elements at the periphery of each IMC, angularly spaced by 180°, but the circuit operates differently.

It is noted that the Hall elements H1a and H1b are "associated" in the meaning as described above, despite their relatively large distance, and that the Hall elements H2a and H2b are "associated", and the first set of sensor elements set1 contains H1a, H2a, and the second set of sensor elements set2 contains H1b, H2b.

FIG. 9A illustrates a first mode of operation. Using for example a configurable interconnection circuit as shown in FIG. 4C in the first configuration mode (in which the switch is closed), the following combined signals can be measured: (h1a+h1b), and (h2a+h2b). It turns out that a difference of the combined signals denoted as Bx_avg, can be seen as twice the magnetic field component Bx that would be measured halfway between the two IMC disks, and that the sum of the combined signals, denoted as Bz_avg can be seen as twice the magnetic field component Bz that would be measured halfway between the two IMC disks. A first angle φ_avg may be calculated as an arctangent of a ratio of the values Bx_avg and Bz_avg.

FIG. 9B illustrates a second mode of operation. Using for example a configurable interconnection circuit as shown in FIG. 4C in the second configuration mode (in which the switch is open), the following individual signals can be measured: (h1a) and (h2a). It turns out that a difference of these individual signals, denoted as Bx_part, corresponds to the magnetic field component Bx measured at IMC1, and that the sum of these individual signals, denoted as Bz_part corresponds to the magnetic field component Bz measured at IMC1. As mentioned above, this difference and sum may be generated in the analog domain (e.g. as illustrated in FIG. 5C), or in the digital domain (e.g. in the digital processor). A second angle φ_part may be calculated as an arctangent of a ratio of the values Bx_avg and Bz_avg.

A consistency check can be performed by comparing corresponding "combined signals" and "individual signals", and/or by comparing corresponding magnetic field components, and/or by comparing the first angular value φ_avg and the second angular value φ_part. The latter may be performed for example by testing if |φ_full−φ_part−ψ|<ε, where w is a predefined value, and ε is a predefined threshold (e.g. 5° or 2° or 1°). It is noted that the value of w may be different from 0°, and may depend on the application (e.g. on the dimensions of a magnet used in conjunction with the sensor device, or the pole pitch of said magnet), and may be determined and stored in a non-volatile memory during a calibration procedure, and retrieved during normal operation. For example, the consistency check of FIG. 9B may:
 i) compare combined signals and corresponding individual signals:
  compare (h2a+h2b) and (h2a)
  compare (h1a+h1b) and (h1a)
 and/or ii) compare components:
  compare Bx_avg and 2*Bx_part,
  compare Bz_avg with 2*Bz_part,
 and/or iii) compare angles:
  compare φ_avg and φ_part.

As mentioned above, it is also possible to perform the consistency check outside of the sensor device, in which case the values to be compared are output by the sensor device to an external processor. Of course it is also possible to perform a consistency check inside the sensor device as well as outside the sensor device.

Figure 10:
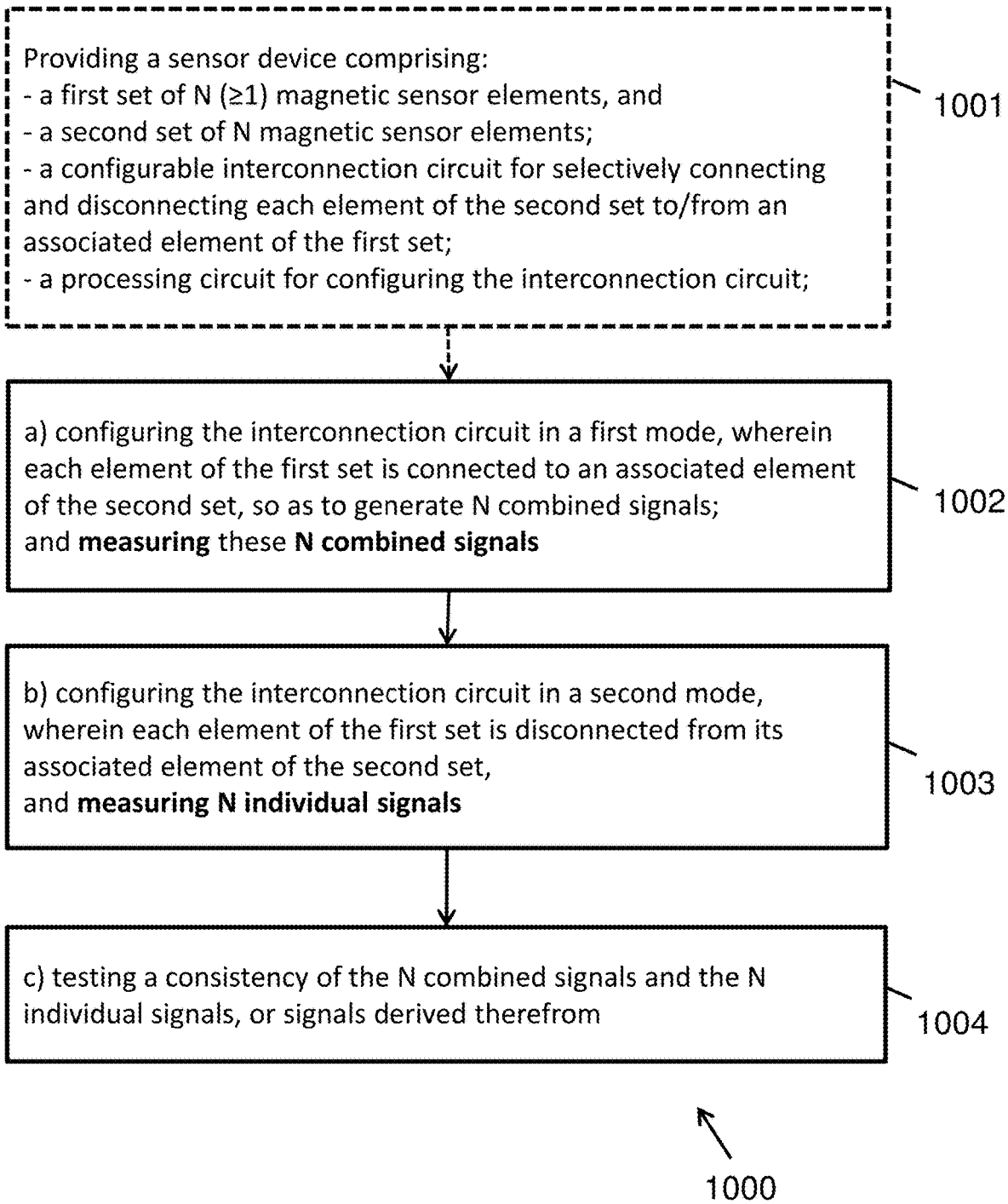
FIG. 10 shows a flow-chart of a method according to an embodiment of the present invention.

FIG. 10 shows a flow-chart of a method 1000, as can be performed by a sensor system according to embodiments of the present invention. At system level, it does not matter whether the consistency test is performed inside the sensor device itself, or outside, and whether a second processor is present or not, as long as a consistency check is performed at least once. The method 1000 comprises the following steps:
 a) configuring 1002 the interconnection circuit of a sensor device as described above (e.g. a sensor device having a first set of N (≥1) magnetic sensor elements; and a second set of N magnetic sensors; and a configurable interconnection circuit for selectively connecting and disconnecting each magnetic sensor element of the second set to/from an associated magnetic sensor element of the first set; and a processing circuit for configuring the interconnection circuit in a first mode in which each element of the first set is connected to an associated element of the second set so to generate N combined signal, and measuring these N combined signals;
 b) configuring 1003 the interconnection circuit in a second mode in which each element of the first set is disconnected from its associated element of the second set, and measuring N individual signals provided by the magnetic sensor elements of the first set;
 c) testing a consistency 1004 of the N combined signals and the N individual signals, or signals derived therefrom.

The method may comprise an additional step a) of providing 1001 said sensor device.

As explained above, all the steps of this method may be performed by the sensor device itself, or partially by the sensor device (e.g. step a and b), and partially (e.g. the consistency check of step c) by a second device communicatively connected to the sensor device (e.g. an ECU). In this case the sensor device will provide the N combined signals and the N individual signals and/or signals derived therefrom to the second device, for example selected from the group consisting of: first difference signals derived from the combined signals, first sum signals derived from the individual signals, a first angular value derived from combined signals or from first difference signals, a second angular value derived from individual signals or from second difference signals, In case a consistency check is performed by the sensor device itself, as well as by the second device, a system with a high confidence level or a high degree of integrity can be build. Embodiment of the present invention are particularly useful in robotic, industrial or automotive applications.

Many specific embodiments of this method are possible, not only dependent on which kind of combination is used (e.g. sum or average or weighted average), but also which processor performs the consistency check (e.g. internal or external processor), and/or which sensor structure is implemented in the sensor device:
 in all embodiment of FIG. 3A to FIG. 9B, at least one combined signal and at least one individual signal is measured. This value may represent a magnetic field component;
 in some embodiment, at least two orthogonal magnetic field components are measured (e.g. Bx and By), and an angle may be calculated based on a ratio of these components.
 in some embodiments, at least one magnetic field component (e.g. Bx) is measured at two different locations, allowing at least one magnetic field gradient (e.g. dBx/dx) to be calculated.
 in some embodiments two orthogonal magnetic field components or two orthogonal magnetic field gradients are determined (e.g. dBx/dx and dBz/dx), and an angle is calculated based on a ratio of these components or gradients.

Sensor devices as described above, may be used in various sensor systems, such as e.g. linear Hall devices (basically comprising only one or two Hall elements without IMC); linear position sensor systems comprising a sensor device as described above and a magnetic structure with a plurality of alternating poles; or such as an angular position sensor system further comprising a permanent magnet which is rotatable relative to the sensor device, or vice versa. The magnet may be an axially or diametrically two-pole ring magnet or disk magnet, or an axially or radially magnetized ring or disk magnet having at least four poles or at least six poles or at least eight poles. The sensor device may be located in an "on-axis" position, or in an "off-axis" position (i.e. at a non-zero radial distance from the rotation axis), or in a "satellite position" (i.e. at a radial position larger than the outer radius of the magnet, and preferably in an axial position halfway between a bottom and top surface). But the present invention is not limited to position sensor devices and systems, and may also be used in other applications, such as e.g. current sensors, proximity sensors, etc. with diagnostic capabilities.

Figure 11:
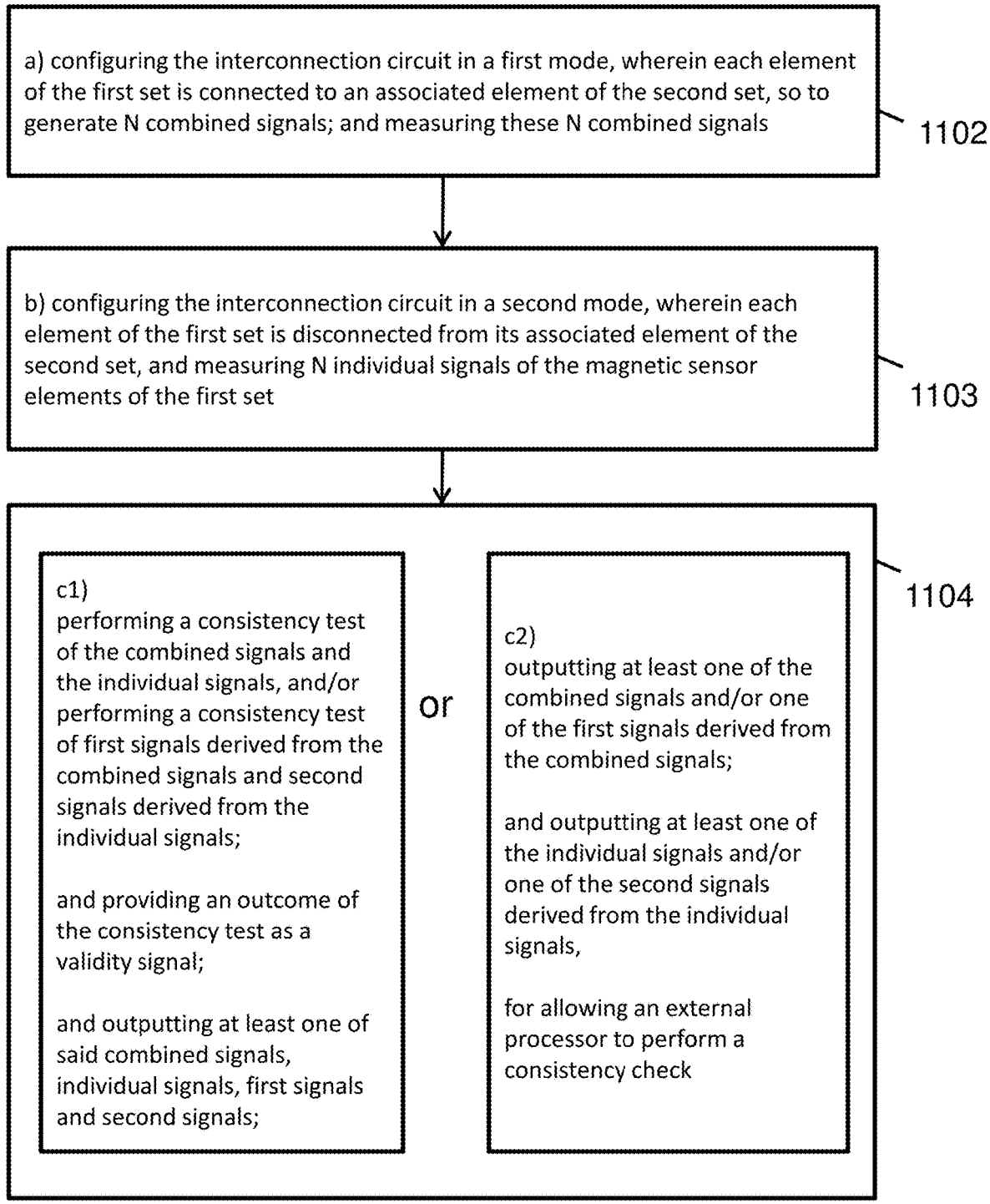
FIG. 11 shows a flow-chart of a method according to an embodiment of the present invention.

FIG. 11 shows a flow-chart of a method 1100 which can be performed by a sensor device as described above. The sensor device comprises a first set (set1) of N magnetic sensor elements, N being at least one; a second set (set2) of N magnetic sensor elements; a configurable interconnection circuit comprising at least one switch for selectively connecting and disconnecting an element of the second set (set2) to/from an associated element of the first set (set1); and a processing circuit for configuring the interconnection circuit. The method comprises the steps of:
 a) configuring 1102 the interconnection circuit in a first mode wherein each element of the first set (set1) is connected to an associated element of the second set (set2) (e.g. in parallel or in series) for generating N combined signals, and measuring these N combined signals;
 b) configuring 1103 the interconnection circuit in a second mode wherein each element of the first set (set1) is disconnected from its associated element of the second set (set2), and measuring N individual signals from the N magnetic sensor elements of the first set (set1);

c1) performing a consistency test of the combined signals and the individual signals, and/or performing a consistency test of first signals derived from the combined signals and second signals derived from the individual signals; and providing an outcome of the consistency test as a validity signal; and outputting at least one of said combined signals, individual signals, first signals and second signals;

or c2) outputting at least one of the combined signals and/or one of the first signals derived from the combined signals, and outputting at least one of the individual signals and/or one of the second signals derived from the individual signals, for allowing an external processor to perform a consistency check.

This method can be spelled out in more detail for each of the particular embodiments illustrated in FIG. 3A to FIG. 9B.

The invention claimed is:

1. A method of measuring at least one magnetic quantity in a reliable manner, using an integrated circuit that comprises:
   a first set of N magnetic sensor elements, N being at least one;
   a second set of N magnetic sensor elements;
   a configurable interconnection circuit adapted for selectively connecting and disconnecting an element of the second set to/from an associated element of the first set; and
   a processing circuit for configuring the interconnection circuit;
   the method comprising the steps of:
      a) configuring the interconnection circuit in a first mode wherein each element of the first set is connected to an associated element of the second set for generating N combined signals, and measuring these N combined signals;
      b) configuring the interconnection circuit in a second mode wherein each element of the first set is disconnected from its associated element of the second set, and measuring N individual signals from the N magnetic sensor elements of the first set;
      c) performing a consistency test of the combined signals and the individual signals, and/or performing a consistency test of first signals derived from the combined signals and second signals derived from the individual signals; and providing an outcome of the consistency test as a validity signal; and outputting at least one signal selected from the group consisting of said combined signals, said individual signals, said first signals and said second signals; or outputting at least one of the combined signals and/or one of the first signals derived from the combined signals, and outputting at least one of the individual signals and/or one of the second signals derived from the individual signals, for allowing an external processor to perform a consistency check.

2. The method according to claim 1, wherein step c) comprises one of the following options:
   i) outputting the N combined signals, and testing a consistency of the N combined signals and the N individual signals, and providing an outcome of the consistency test as a validity signal;
   ii) outputting the N combined signals and the N individual signals, for allowing an external processor to perform a consistency test;
   iii) determining at least one first signal derived from the N combined signals, and determining at least one second signal derived from the N individual signals; and testing a consistency of the N combined signals and the N individual signals, and/or testing a consistency of the at least one first signal and the at least one second signal, and/or testing a consistency of at least one further first signal derived from the first signal and at least one further second signal derived from the second signal; providing an outcome of the consistency test as a validity signal; and outputting at least one signal selected from the group consisting of said N combined signals, said N individual signals, said at least one first signal, said at least one second signal, said at least one further first signal, and said at at least one further second signal;
   iv) determining at least one first signal derived from the N combined signals and determining at least one second signal derived from the N individual signals; and outputting the at least one first signal and the at least one second signal, and/or outputting at least one further first signal derived from the first signal and at least one further second signal derived from the second signal, for allowing an external processor to perform a consistency test.

3. The method according to claim 1, wherein the interconnection circuit comprises N switches, each switch being adapted for selectively connecting a magnetic sensor element of the first set in parallel or in series with an associated magnetic sensor element of the second set.

4. The method according to claim 1, further comprising:
   determining at least one first difference signal by subtracting two combined signals, and determining at least one second difference signal by subtracting two individual signals; and
   wherein step iii) comprises: testing a consistency of the at least one first difference signal and the at least one second difference signal; and
   wherein step iv) comprises: outputting the at least one first difference signal, and outputting the at least one second difference signal, for allowing an external processor to perform the consistency test.

5. The method according to claim 1, further comprising:
   determining at least one first sum signal by adding two combined signals, and determining at least one second sum signal by adding two individual signals; and
   wherein step iii) comprises: testing a consistency of the at least one first sum signal and the at least one second sum signal; and
   wherein step iv) comprises: outputting the at least one first sum signal, and outputting the at least one second sum signal, for allowing an external processor to perform the consistency test.

6. The method according to claim 1, further comprising:
   determining at least one first difference signal by subtracting two combined signals, and determining at least one second difference signal by subtracting two individual signals, and
   calculating a first angular value ($\varphi xy\_full$) based on a ratio of two first difference signals, and calculating a second angular value ($\varphi xy\_part$) based on a ratio of two second difference signals; and
   wherein step iii) comprises: testing a consistency of the first angular value ($\varphi xy\_full$) and the second angular value ($\varphi xy\_part$); and wherein step iv) comprises: outputting the first angular value ($\varphi xy\_full$) and the second angular value ($\varphi xy\_part$), for allowing an external processor to perform the consistency test.

7. The method according to claim 1, further comprising:
determining at least one first difference signal by subtracting two combined signals, and determining at least one second difference signal by subtracting two individual signals, and
determining at least one first sum signal by adding or averaging two combined signals, and determining at least one second sum signal by adding or averaging two individual signals, and
calculating a first angular value ($\varphi xz\_full$) based on a ratio of a first difference signal and a first sum signal, and calculating a second angular value ($\varphi xz\_part$) based on a ratio of a second difference signal and a second sum signal; and
wherein step iii) comprises: testing a consistency of the first angular value ($\varphi xz\_full$) and the second angular value ($\varphi xz\_part$); and
wherein step iv) comprises: outputting the first angular value ($\varphi xz\_full$) and the second angular value ($\varphi xz\_part$), for allowing an external processor to perform the consistency test.

8. The method according to claim 1, further comprising:
determining at least one first difference signal by subtracting two combined signals, and determining at least one second difference signal by subtracting two individual signals, and/or determining at least one first sum signal by adding or averaging two combined signals, and determining at least one second sum signal by adding or averaging two individual signals, and
determining at least one third difference signal by subtracting two first difference signals or by subtracting two first sum signals, and determining at least one fourth difference signal by subtracting two second difference signals or by subtracting two second sum signals; and
wherein step iii) comprises: testing a consistency of the at least one third difference signal and the at least one fourth difference signal; and
wherein step iv) comprises: outputting the at least one third difference signal and the at least one fourth difference signal, for allowing an external processor to perform the consistency test.

9. The method according to claim 1, further comprising:
determining at least one first difference signal by subtracting two combined signals, and determining at least one second difference signal by subtracting two individual signals, and/or determining at least one first sum signal by adding or averaging two combined signals, and determining at least one second sum signal by adding or averaging two individual signals, and
determining at least one third difference signal by subtracting two first difference signals or by subtracting two first sum signals, and determining at least one fourth difference signal by subtracting two second difference signals or by subtracting two second sum signals; and
calculating a first angular value ($\varphi xy\_full$, $\varphi xz\_full$) based on a ratio of two third difference signals, and calculating a second angular value ($\varphi xy\_part$, $\varphi xz\_part$) based on a ratio of two fourth difference signals; and wherein step iii) comprises: testing a consistency of the first angular value ($\varphi xy\_full$, $\varphi xz\_full$) and the second angular value ($\varphi xy\_part$, $\varphi xz\_part$); and
wherein step iv) comprises: outputting the first angular value ($\varphi xy\_full$, $\varphi xz\_full$) and the second angular value ($\varphi xy\_part$, $\varphi xz\_part$), for allowing an external processor to perform the consistency test.

10. A method of determining a linear or angular position of a sensor device which is movable relative to a magnetic source or vice versa, and detecting an error, the method comprising:
a) determining at least one angular value ($\Phi\_full$) and detecting the error using the method according to claim 1; and
b) converting the at least one angular value into the linear or angular position.

11. A sensor device comprising an integrated circuit comprising:
a first set of N magnetic sensor elements, N being at least one;
a second set of N magnetic sensor elements,
a configurable interconnection circuit for selectively connecting and disconnecting each element of the second set to/from an associated element of the first set, and
a processing circuit configures for;
a) configuring the interconnection circuit in a first mode wherein each element of the first set is connected to an associated element of the second set for generating N combined signals, and measuring these N combined signals;
b) configuring the interconnection circuit in a second mode wherein each element of the first set is disconnected from its associated element of the second set, and measuring N individual signals from the N magnetic sensor elements of the first set;
c) performing a consistency test of the combined signals and the individual signals, and/or performing a consistency test of first signals derived from the combined signals and second signals derived from the individual signals; and providing an outcome of the consistency test as a validity signal; and outputting at least one signal selected from the group consisting of said combined signals, said individual signals, said first signals and said second signals; or
outputting at least one of the combined signals and/or one of the first signals derived from the combined signals, and outputting at least one of the individual signals and/or one of the second signals derived from the individual signals, for allowing an external processor to perform a consistency check.

12. The sensor device of claim 11,
wherein each of the first and second set of N magnetic sensor elements comprises a vertical Hall element; or
wherein each of the first and second set of N magnetic sensor elements comprises two vertical Hall elements oriented in orthogonal directions; or
wherein each of the first and second set of N magnetic sensor elements comprises four horizontal Hall elements arranged near the periphery of a circular IMC, wherein the Hall elements of the first set are spaced apart by multiples of 90°, and
wherein the Hall elements of the second set are spaced apart by multiples of 90°, and
wherein the Hall elements of the second set are located at a distance smaller than 80 μm with respect to the associated Hall elements of the first set; or wherein each of the first and second set of N magnetic sensor elements comprises four horizontal Hall elements arranged near the periphery of a first circular IMC, and four horizontal Hall elements arranged near the periphery of a second circular IMC; or wherein each of the first and second set of N magnetic sensor elements comprises two horizontal Hall elements arranged near the periphery of a first circular IMC, and two horizontal Hall elements arranged near the periphery of a second circular IMC; or wherein the first set of N magnetic sensor elements comprises two horizontal Hall elements arranged near the periphery of a first integrated magnetic concentrator and spaced 180° apart, and the second set of N magnetic sensor elements comprises two horizontal Hall elements arranged near the periphery of a second integrated magnetic concentrator and spaced 180° apart.

13. The sensor device according to claim 11,
wherein the sensor device is a linear Hall device, configured for measuring a magnetic field component; or
wherein the sensor device is a current sensor device, configured for measuring an electrical current flowing through a conductor; or
wherein the sensor device is a proximity sensor device, configured for detecting the presence or absence of a target within a predefined range; or
wherein the sensor device is an angular position sensor device, configured for providing an angular position of the sensor device relative to a magnetic source; or
wherein the sensor device is a linear position sensor device, configured for providing a linear position of the sensor device relative to a magnetic structure having a plurality of alternating poles.

14. A magnetic sensor system comprising:
the sensor device according to claim 11; and
a second processor communicatively connected to the sensor device and configured for receiving at least some of the signals which are output by the sensor device, and in case of option ii) and option iv) further configured for performing said consistency test.

15. The magnetic sensor system according to claim 14, further comprising a magnetic source.

16. The sensor device according to claim 11, wherein N is an integer value of at least one.

* * * * *